(12) United States Patent
Kayanuma

(10) Patent No.: US 7,305,044 B2
(45) Date of Patent: Dec. 4, 2007

(54) DATA MODULATION METHOD AND APPARATUS

(75) Inventor: Kinji Kayanuma, Tokyo (JP)

(73) Assignee: NEC Corporation, Tokyo (JP)

(*) Notice: Subject to any disclaimer, the term of this patent is extended or adjusted under 35 U.S.C. 154(b) by 892 days.

(21) Appl. No.: 10/642,749

(22) Filed: Aug. 19, 2003

(65) Prior Publication Data

US 2004/0184555 A1    Sep. 23, 2004

(30) Foreign Application Priority Data

Aug. 20, 2002    (JP)    ............... 2002-239258

(51) Int. Cl.
    *H04L 27/00*    (2006.01)
(52) U.S. Cl. .................................. 375/295
(58) Field of Classification Search ................ 375/263, 375/295, 264, 253, 254; 369/47.15, 47.19, 369/47.28, 47.32, 59.25

See application file for complete search history.

(56) References Cited

U.S. PATENT DOCUMENTS

| | | | |
|---|---|---|---|
| 5,608,397 A * | 3/1997 | Soljanin | 341/58 |
| 5,917,857 A | 6/1999 | Tanaka et al. | |
| 5,960,041 A * | 9/1999 | Calderbank et al. | 375/292 |
| 6,002,718 A * | 12/1999 | Roth | 375/240 |
| 6,879,637 B1 | 4/2005 | Nakagawa et al. | |
| 2005/0156760 A1 | 7/2005 | Nakagawa et al. | |
| 2005/0162290 A1 | 7/2005 | Nakagawa et al. | |
| 2005/0162291 A1 | 7/2005 | Nakagawa et al. | |

FOREIGN PATENT DOCUMENTS

| | | |
|---|---|---|
| JP | 7-240691 A | 9/1995 |
| JP | 9-162744 A | 6/1997 |
| JP | 10-340543 | 12/1998 |
| JP | 11-177431 A | 7/1999 |
| JP | 2000-68846 A | 3/2000 |

* cited by examiner

Primary Examiner—Khanh C. Tran
(74) Attorney, Agent, or Firm—Foley & Lardner LLP

(57) ABSTRACT

A data bit stream is segmented into 4-bit data words and successively shifted two bits at a time. For each 4-bit data word a corresponding 3-bit code word is detected in a conversion table. Two higher significant bits of each data word is converted to the detected code word and two lower significant bits of the data word is then converted as two higher significant bits of a subsequent data word to a corresponding code word, so that a channel bit stream formed by a series of such code words has no consecutive 1's. A digital sum value of the channel bit stream is determined and a search is made for a code word "010" which is consecutive with a code word "000". The detected code word "010" is replaced with a substitute code word "000" if the replacement results in the digital sum value approaching zero.

44 Claims, 18 Drawing Sheets

SUB-CONVERSION TABLE 120

| DATA BITS | CHANNEL BITS |
|---|---|
| 0000 | 101000 |
| 0001 | 100000 |
| 1000 | 001000 |
| 1001 | 010000 |

MAIN CONVERSION TABLE 110

| DATA BITS | CHANNEL BITS |
|---|---|
| 00 | 101 |
| 01 | 100 |
| 10 | 001 |
| 11 | 010 |

DATA BITS  0 1 0 0 1 1 1 1 0 0 1 1 1 0 1 0 0 1 0 0 0 1

CONVERSION →

CHANNEL BITS  100 101 010 001000 010 001000 010 001 010000 100000

POSITION OF DSV CONTROL BIT

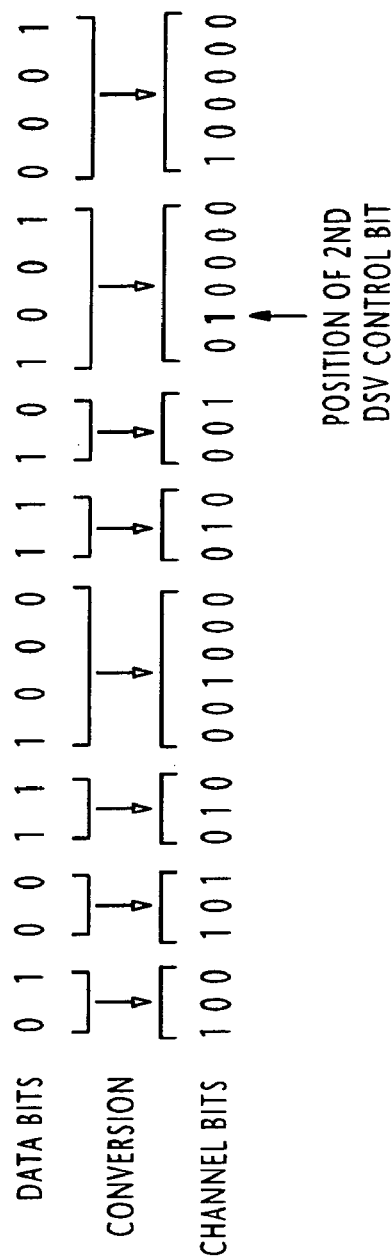

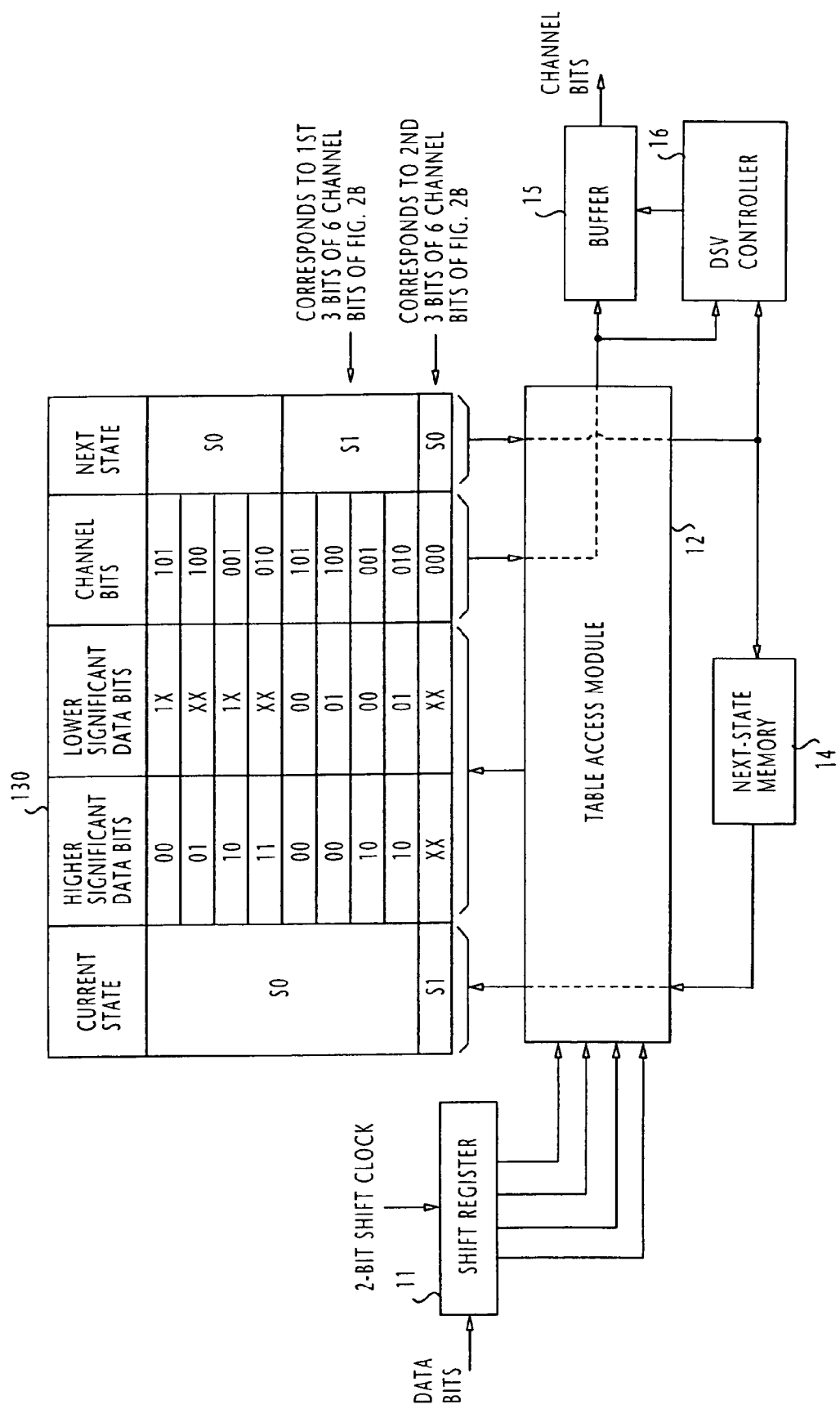

FIG. 17

| | EVEN | ODD |
|---|---|---|
| SY0 | 010.000.000.000.001.000.001.010 | 010.000.000.000.001.000.001.000 |
| SY1 | 010.000.000.000.001.000.100.010 | 010.000.000.000.001.000.100.000 |
| SY2 | 010.000.000.000.001.010.000.010 | 010.000.000.000.001.010.100.100 |
| SY3 | 010.000.000.000.001.000.010.100 | 010.000.000.000.001.010.010.100 |
| SY4 | 010.000.000.000.001.001.000.100 | 010.000.000.000.001.010.101.000 |
| SY5 | 010.000.000.000.001.000.101.000 | 010.000.000.000.001.000.101.010 |
| SY6 | 010.000.000.000.001.010.001.000 | 010.000.000.000.001.010.001.010 |
| SY7 | 010.000.000.000.001.001.010.000 | 010.000.000.000.001.001.010.010 |

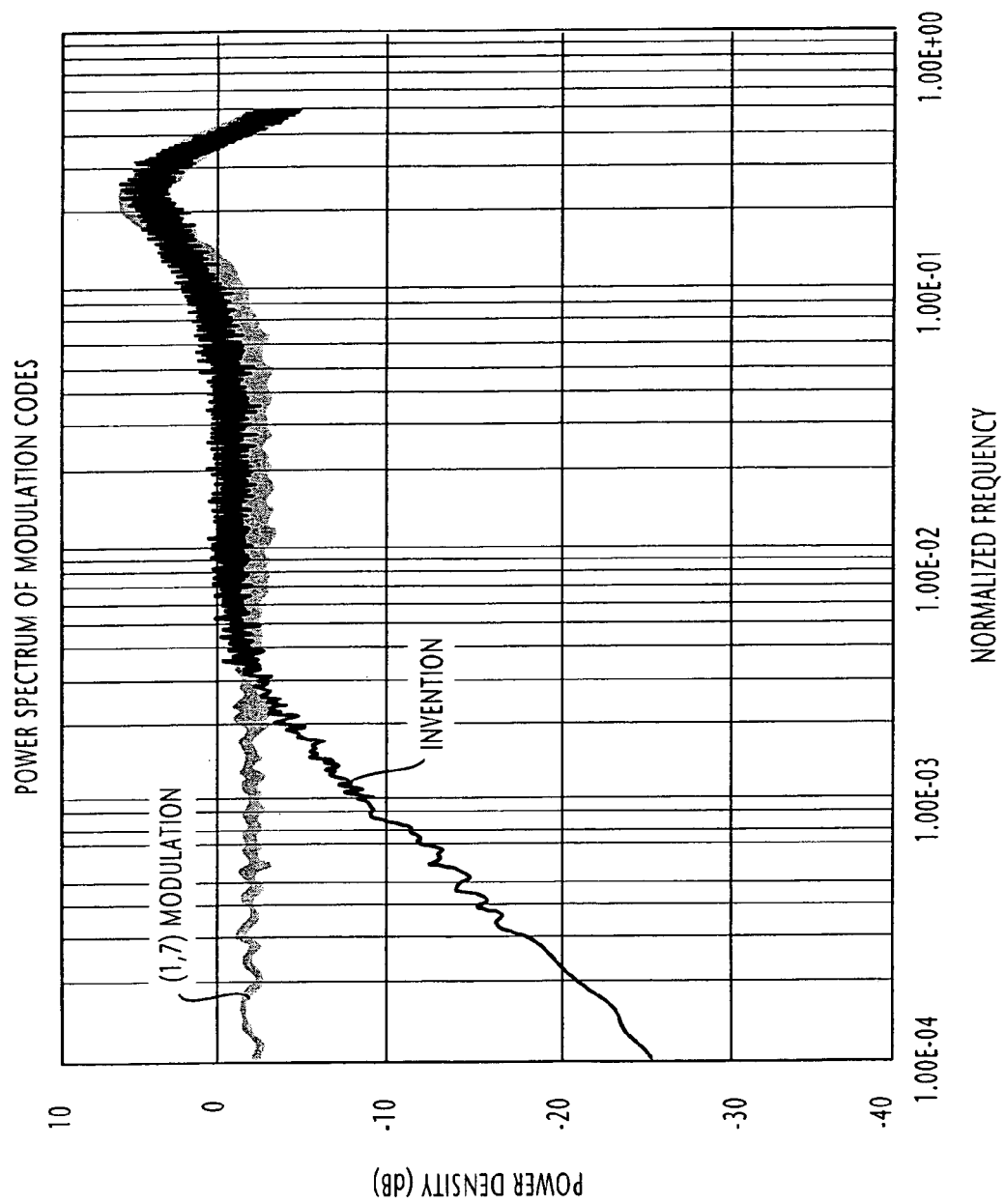

DATA MODULATION METHOD AND APPARATUS

BACKGROUND OF THE INVENTION

1. Field of the Invention

The present invention relates generally to recording of digital signals on optical or magnetic discs and more specifically to a data modulation method and apparatus for converting a data bit stream to a channel bit stream having a small d.c. content (or digital sum value).

2. Description of the Related Art

Prior to recording on an optical or magnetic disc, the format of a digital signal is converted, or modulated into a format appropriate for the characteristics of the disc. DC content is a concern in digital signals, which alternate between "1" and "0" irregularly. If there is an imbalance between the total number of ones or zeros, the imbalance will result in a signal having a d.c. content. DC content is a concern with magnetic recording heads. If the magnetic polarity is switched more to one direction than the other, this polarity imbalance will remain in the head and cause a d.c. offset in its ability to play back digital signals. DC content is also a concern with a laser mechanism which reads pits and lands on the surface of an optical disc. In a digital system, the d.c. content is termed digital sum value (DSV), which is the difference between the total number of ones and the total number of zeros. If NRZI waveform is used for recording, the DSV is a total sum of +1 for a bit "1" and −1 for a bit "0", starting from the beginning of a channel bit stream. The pits and lands are read by a system of lasers that are controlled by a servo actuator. The actuator must maintain precise alignment with the tracks on the disc and with the transition boundaries between pit and land areas. The transitions in the signal, represented by the ones, enable the servo actuator to maintain correct alignment with the track. Thus, a signal having a d.c. content will result in the servo actuator drifting out of proper alignment with the track.

In DVD (Digital Versatile Disc) recording systems, the 8-16 modulation scheme is employed to convert 8-bit data words of a data bit stream to 16-bit code words to form a channel bit stream so that the run length of the channel bit stream is constrained to (2, 10), i.e., the number of 0's that exist between any two 1's is a minimum of two and a maximum of ten. The 8-16 modulation has the ability to reduce the d.c. content of a signal by selecting a particular code word from a set of tables based on the DSV of the signal.

The 8-16 modulation has a coding rate 1/2. The coding rate is of a concern to the design of a recording system because higher the coding rate a longer time is allowed to detect a "1" bit from the channel bit stream. The (1, 7) modulation is another coding scheme known in the art as having a run length of a minimum of one "0" and a maximum of seven 0's and a coding rate 2/3. Because of its higher coding rate, the (1, 7) modulation is suitable for high-density digital recording. However, its d.c. content is high, which results in a degraded jitter performance if an a.c.-coupled circuit is used in a playback system and results in a decision threshold varying randomly about the correct level.

Japanese Patent Publication 1998-340543 discloses a d.c.-content reduction method for the (1, 7) modulation codes by introducing a 6-bit DSV control code of 3 replacement bits and 3 redundant bits into a data bit stream at regular intervals prior to conversion to a channel bit stream. However, the use of the extra 3-bit redundant bits results in a lowering of the coding rate.

Another concern to the design of a recording system is a bit pattern in which bits "1" occur at minimum intervals 2T (where T is the channel bit length) such as "010101010". The (1, 7) modulation generates such 2T-bit patterns frequently as compared to other modulation schemes. Because of the closely spaced bits "1", inter-symbol interference occurs, making it difficult to extract clock information from playback signals. Furthermore, noise is introduced to the decision threshold, resulting in a timing error which causes a delayed detection of a full 2T bit pattern by the length of a single bit.

SUMMARY OF THE INVENTION

It is therefore a primary object of the present invention to provide a data modulation method and apparatus which reduces the lower frequency components of a digital signal including the d.c. content without lowering its coding rate.

Another object of the present invention is to provide a data modulation method and apparatus which reduces the lower frequency while preventing the repeated occurrence of a 2T bit pattern.

The primary object of the present invention is obtained by detecting a particular bit pattern in a channel bit stream and using a single bit "1" of the detected pattern as a DSV control bit.

According to a first aspect of the present invention, there is provided a data modulation method comprising the steps of converting an N-bit data word of a data bit stream to an M-bit code word and storing a plurality of M-bit code words in a buffer to form a channel bit stream, where the integer M is greater than the integer N, determining a digital sum value of the channel bit stream, detecting a bit sequence of a predetermined pattern in the stored channel bit stream, and replacing a bit "1" of the detected bit sequence with a bit "0" if the replacement results in the digital sum value approaching zero.

The channel bit stream is searched for detecting a bit sequence "010.101.010". If such a bit sequence is detected, it is replaced with a substitute bit sequence "000. 000. 000".

According to a second aspect, the present invention provides a data modulation method comprising the steps of mapping a plurality of 4-bit data words to a plurality of 3-bit code words in a memory, segmenting a data bit stream into a plurality of 4-bit data words by successively shifting two bits at a time, converting higher significant two bits of each 4-bit data word to a 3-bit code word correspondingly mapped to the 4-bit data word in the memory and converting lower significant two bits of the 4-bit data word as higher significant two bits of a subsequent 4-bit data word to a 3-bit code word correspondingly mapped to the subsequent 4-bit data word so that a channel bit stream having no consecutive 1's is produced by a plurality of said 3-bit code words, determining a digital sum value of the channel bit stream, detecting a first predetermined one of the 3-bit code words which is consecutive with a second predetermined one of the 3-bit code words, and replacing the detected code word with a code word "000" if the replacement results in the digital sum value approaching zero.

According to a third aspect, the present invention provides a data modulation method comprising the steps of mapping, in a memory, 2-bit data words "00", "01", "10" and "11" to 3-bit code words "101", "100", "001" and "010", respectively, and mapping 4-bit data words "0000", "0001", "1000" and "1001" to 6-bit code words "101000", "100000", "001000" and "010000", respectively, segmenting a data bit stream into a plurality of 4-bit data words, converting each of the 4-bit data words to a 6-bit code word mapped in the memory if the 4-bit data word is coincident with one of the mapped 4-bit data words and converting higher significant two bits of the 4-bit data word to a 3-bit code word mapped in the memory if the 4-bit data word is non-coincident with any of the mapped 4-bit data words so that a channel bit stream having no consecutive 1's is formed by a plurality of 6-bit code words and a plurality of 3-bit code words, forming a subsequent 4-bit data word with lower significant bits of the non-coincident data word, determining a digital sum value of the channel bit stream, detecting a code word "010" which occurs immediately following any one of the 6-bit code words, and replacing the detected code word with a code word "000" if the replacement results in the digital sum value approaching zero.

According to a fourth aspect, the present invention provides a data modulation method comprising the steps of mapping, in a memory, 2-bit data words "00", "01", "10" and "11" to 3-bit code words "101", "100", "001" and "010", respectively, and mapping 4-bit data words "0000", "0001", "1000" and "1001" to 6-bit code words "101000", "100000", "001000" and "010000", respectively, segmenting a data bit stream into a plurality of 4-bit data words, converting each of the 4-bit data words to a 6-bit code word mapped in the memory if the 4-bit data word is coincident with one of the mapped 4-bit data words, and converting higher significant two bits of the 4-bit data word to a 3-bit code word mapped in the memory if the 4-bit data word is non-coincident with any of the mapped 4-bit data words so that a channel bit stream having no consecutive 1's is formed by a plurality of 6-bit code words and a plurality of 3-bit code words, forming a subsequent 4-bit data word with lower significant bits of the non-coincident data word, determining a digital sum value of the channel bit stream, detecting a code word "010000" which occurs immediately following any one of the 3-bit code words, and replacing the detected code word with a code word "000000" if the replacement results in the digital sum value approaching zero.

According to a fifth aspect, the present invention provides a data modulation method comprising the steps of mapping, in a memory, 2-bit data words "00", "01", "10" and "11" to 3-bit code words "101", "100", "001" and "010", respectively, and mapping 4-bit data words "0000", "0001", "1000" and "1001" to 6-bit code words "000101", "000100", "000001" and "000010", respectively, segmenting a data bit stream into a plurality of 4-bit data words, converting each of the 4-bit data words to a 6-bit code word mapped in the memory if the 4-bit data word is coincident with one of the mapped 4-bit data words, and converting higher significant two bits of the 4-bit data word to a 3-bit code word mapped in the memory if the 4-bit data word is non-coincident with any of the mapped 4-bit data words so that a channel bit stream having no consecutive 1's is formed by a plurality of 6-bit code words and a plurality of 3-bit code words, forming a subsequent 4-bit data word with lower significant bits of the non-coincident data word, determining a digital sum value of the channel bit stream, detecting a code word "010" which is immediately followed by any one of the 6-bit code words, and replacing the detected code word with a code word "000" if the replacement results in the digital sum value approaching zero.

According to a further aspect, the present invention provides a data modulation method comprising the steps of mapping, in a memory, 2-bit data words "00", "01", "10" and "11" to 3-bit code words "101", "100", "001" and "010", respectively, and mapping 4-bit data words "0000", "0001", "1000" and "1001" to 6-bit code words "000101", "000100", "000001" and "000010", respectively, segmenting a data bit stream into a plurality of 4-bit data words, converting each of the 4-bit data words to a 6-bit code word mapped in the memory if the 4-bit data word is coincident with one of the mapped 4-bit data words, converting higher significant two bits of the 4-bit data word to a 3-bit code word mapped in the memory if the 4-bit data word is non-coincident with any of the mapped 4-bit data words, forming a subsequent 4-bit data word with lower significant bits of the non-coincident data word so that a channel bit stream having no consecutive 1's is formed by a plurality of the 6-bit code words and a plurality of the 3-bit code words, determining a digital sum value of the channel bit stream, detecting a code word "000010" which is immediately followed by any one of the 3-bit code words, and replacing the detected code word with a code word "000000" if the replacement results in the digital sum value approaching zero.

BRIEF DESCRIPTION OF THE DRAWINGS

The present invention will be described in detail further with reference to the following drawings, in which:

FIG. 6 is an illustration of exemplary bit sequences for describing the operation of the data modulation apparatus according to the flowchart of FIG. 5;

FIGS. 7A, 7B are illustrations of a main conversion table and a sub-conversion table, respectively, according to a second embodiment of the present invention;

FIG. 12 is a block diagram of the data modulation apparatus according to a further modification of the first embodiment of the present invention;

FIG. 17 is an illustration of a sync pattern table associated with the data modulation apparatus of FIG. 16;

FIG. 21 is a graphic representation of the power density versus normalized frequency for comparison between the present invention and the prior art (1, 7) modulation.

DETAILED DESCRIPTION

Figure 1:
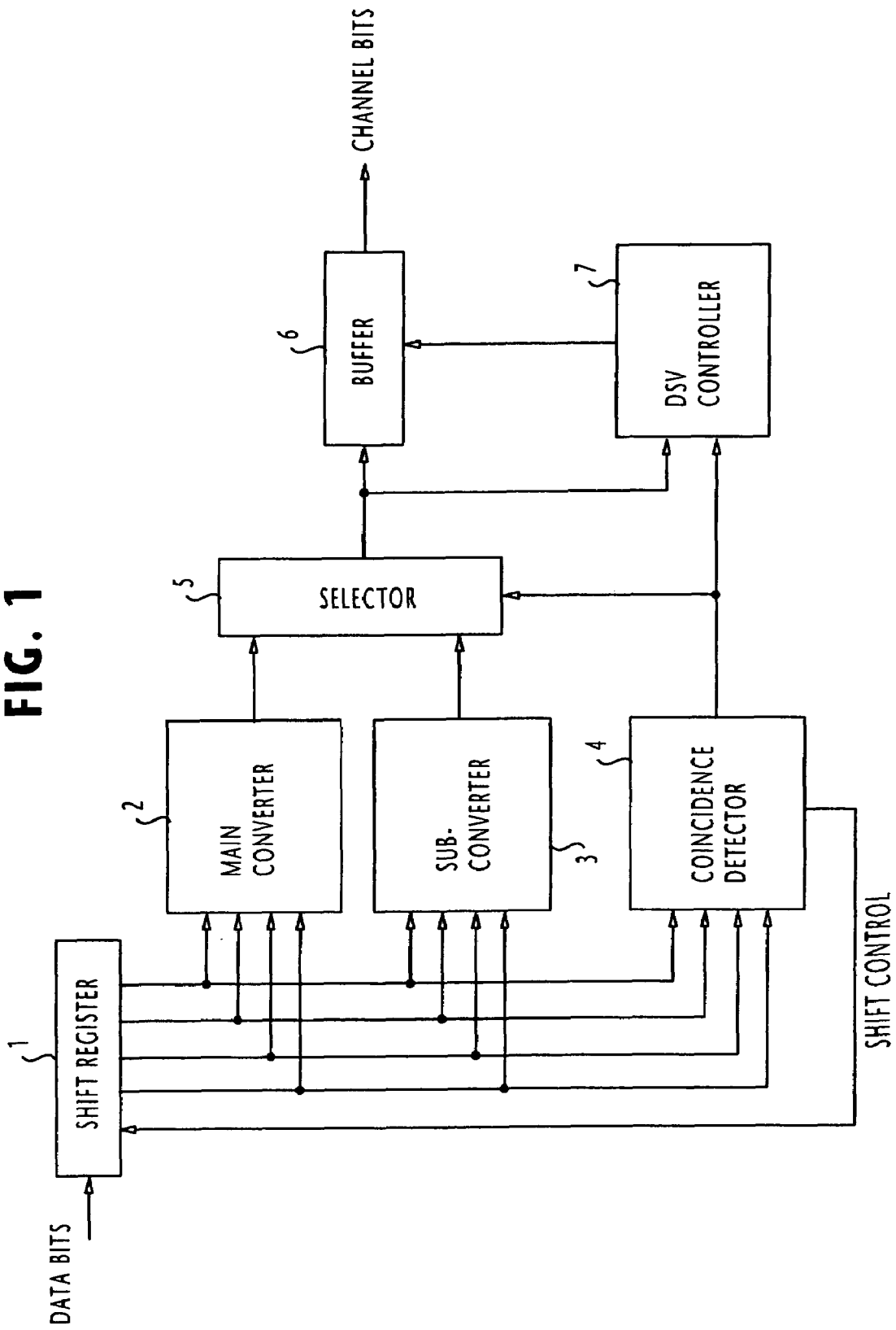
FIG. 1 is a block diagram of a data modulation apparatus of the present invention.
Figures 2A, 2B, 4:
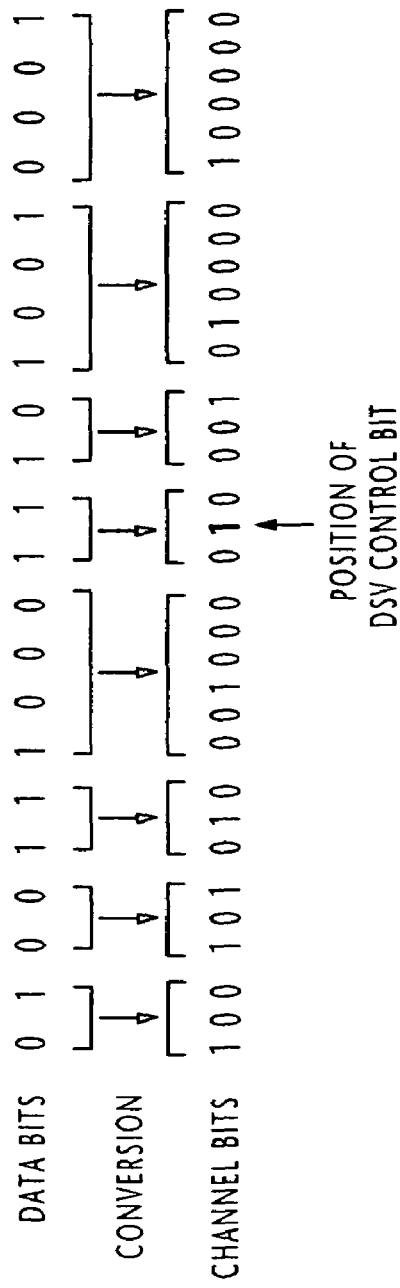
FIGS. 2A, 2B are illustrations of a main conversion table and a sub-conversion table, respectively, according to a first embodiment of the present invention.
FIG. 4 is an illustration of exemplary bit sequences for describing the operation of the first embodiment of the present invention.

Referring now to FIG. 1, there is shown a data modulation apparatus according to a first embodiment of the present invention. The apparatus comprises a shift register 1 for receiving an input bit stream and supplying the bit stream as four data bits in parallel to a main converter 2, a sub-converter 3 and a coincidence detector 4. Main converter 2 and sub-converter 3 respectively include main and sub-conversion tables 110 and 120, as shown in FIGS. 2A and 2B. Main converter 2 reads the higher two bits of the four-bit parallel data as a 2-bit data word and converts this data word to a 3-bit code word, or three channel bits according to the main conversion table 110. Sub-converter 3 converts the four-bit data word to a 6-bit code word, or six channel bits according to the sub-conversion table 120 if the four data bits coincide with one of the data bits listed on the left side of the table 120. Priority is given to the sub-converter 3. If such a coincidence exists in the sub-conversion table 120, the coincidence detector 4 detects this coincidence and commands a selector 5 to select the output of sub-converter 3. If no coincidence exists in the sub-conversion table 120, the coincidence detector 4 commands the selector 5 to select the output of main converter 2.

The output of selector 5 is coupled to a buffer 6 and a DSV (Digital Sum Value) controller 7, to which the output of coincidence detector 4 is also applied.

Figure 3:
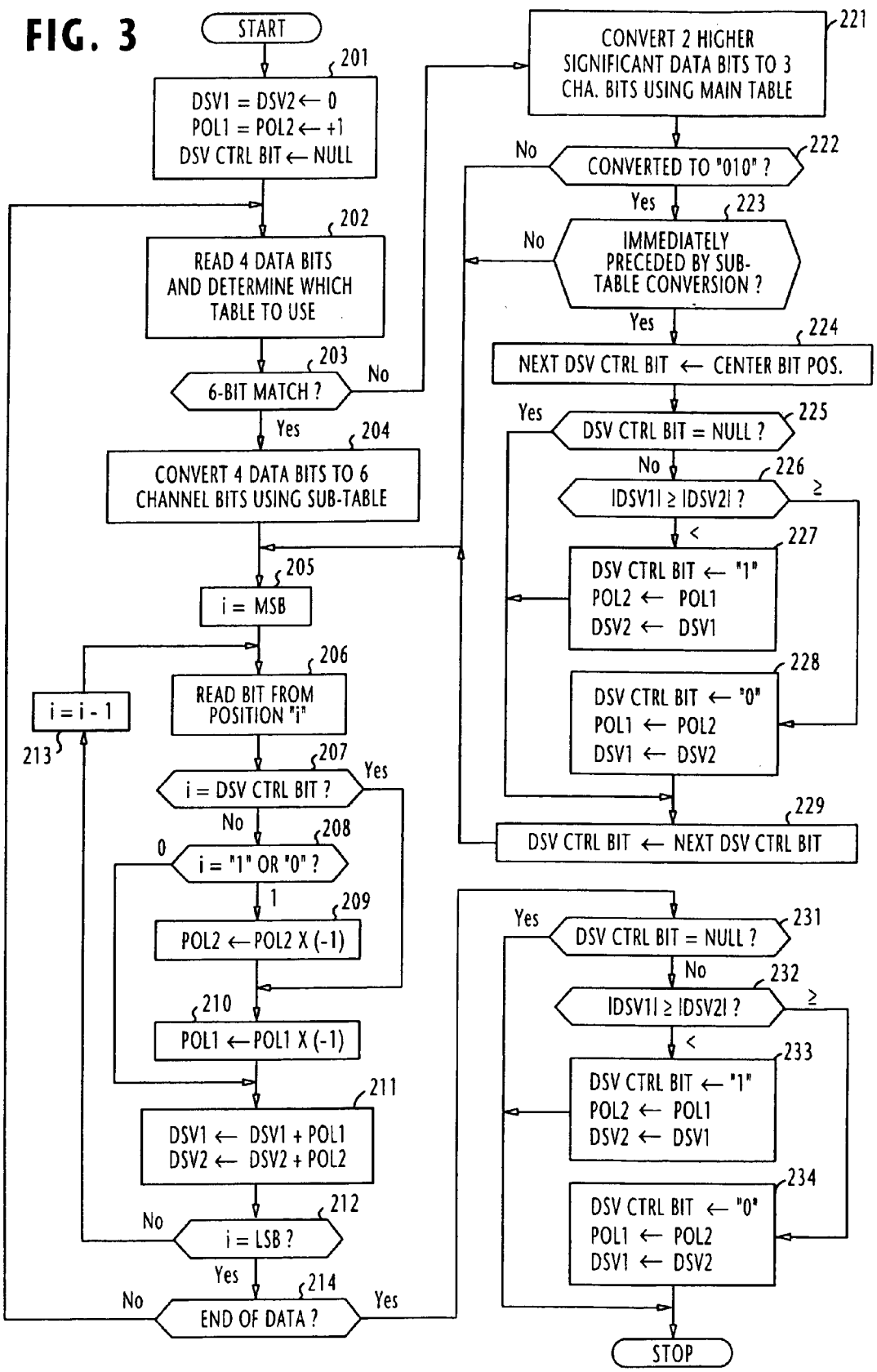
FIG. 3 is a flowchart of the operation of the data modulation apparatus according to the first embodiment of the invention.

The operation of the apparatus, particularly the DSV controller 7, proceeds according to the flowchart of FIG. 3.

At step 201, DSV (digital sum value) parameters DSV1 and DSV2 are set equal to 0 and polarity parameters POL1 and POL2 are both set to +1 and a DSV control bit is set to "null". At step 202, four data bits are read out of the shift register 1 and the coincidence detector 4 determines whether the four data bits match to one of the stored 4-bit data words in the sub-conversion table 120. If a match is detected in the sub-conversion table 120, the apparatus determines, at step 203, that sub-conversion table be used for data modulation. Otherwise, the apparatus determines that the main conversion table 110 be used. Therefore, the sub-conversion table 120 is given priority over the main conversion table 110. Thus, only if the input 4 consecutive data bits are non-coincident with any of the 4-bit data words stored in the sub-conversion table 12, a search is made in the main conversion table 110 for detecting a match between the input 2 consecutive data bits and one of the 2-bit data words stored in the main conversion table 110. With priority given to the sub-conversion table 120 over the main conversion table 110, there is no consecutive 1's in a channel bit stream stored in the buffer 6.

If it is determined that the sub-conversion be used, flow proceeds from step 203 to step 204 to convert the four-bit data to a six-bit code word according to the sub-table 120.

Parameter update subroutine is performed by the DSV controller 7. In this subroutine, the DSV controller updates the DSV and POL parameters and DSV control bit, using each of the channel bits.

At step 205, a variable "i" is set to a decimal number corresponding to the MSB (most significant bit) position of the channel bits. If the sub-table 120 has been used in data modulation, the variable "i" is set to the integer 6. At step 206, the bit in the position "i" is read and examined at step 207 whether the i-position bit is a DSV control bit.

If the i-position bit is other than DSV control bit, flow proceeds from step 207 to step 208 to check to see if the i-position bit is "1" or "0". If i=1, the polarity of POL2 is reversed at step 209 and the polarity of POL1 is reversed at step 210. At step 211, DSV1 is summed with POL1 and DSV2 is summed with POL2. If i=0, the polarity parameters are unchanged and flow proceeds direct from step 208 to step 211.

If the i-position bit is a DSV control bit, flow proceeds from step 207 to step 210 to reverse POL1 and proceeds to step 211.

The variable "i" is decremented by one at step 213, and steps 205 through 211 are repeated for subsequent bit positions until the variable "i" is decremented to LSB=1 at step 212, terminating the parameter update subroutine.

If there is a mismatch between the input four-bit data word and any of the four-bit data words of sub-conversion table 120, flow proceeds from step 203 to step 221 to convert the two higher significant data bits of the input four-bit data word to a three-bit code word (three channel bits) using the main conversion table 110. At step 222, the DSV controller 7 checks to see if the 3-bit code word coincides with a predetermined code word "010".

If the 3-bit code word coincides with "010", flow proceeds to step 223 to determine if the current data modulation is immediately preceded by a sub-table conversion. If so, flow proceeds to step 224 to the center bit position of the three channel bits is set in memory to be used as the bit position of the next DSV control bit. If the current DSV control bit is not in "null" state (step 225), the absolute values of DSV1 and DSV2 are compared with each other at step 226 to determine their relative magnitudes. If |DSV1| is smaller than |DSV2|, flow proceeds to step 227 in which "1" is set to the current DSV control bit and POL1 is copied to POL2 and DSV1 is copied to DSV2. If |DSV1| is equal to or greater than |DSV2|, flow proceeds to step 228 in which "0" is set to the current DSV control bit and POL2 is copied to POL1 and DSV2 is copied to DSV1. As a result, the d.c. content of the channel bit stream approaches zero.

Steps 227 and 228 are followed by step 229 in which the bit position of the next DSV control bit, which was set in memory at step 224, is now set as the bit position of the current DSV control bit, and flow proceeds to step 205 to perform a parameter update subroutine using each bit of the 3-bit code word. If it is determined, at step 225, that the current DSV control bit is null, steps 226, 227, 228 are skipped and flow proceeds to step 229.

If the 3-bit code word is other than "010", the decision at step 222 is negative, or a "010" code word is immediately preceded by another 3-bit code word, the next decision at step 223 is negative. In either case, flow proceeds to step 205 to perform the parameter update subroutine by skipping steps 224 through 229.

When steps 205 to 213 of parameter update subroutine are repeated until all channel bits are used to update the DSV1 and DSV2 parameters, the decision-at step 213 becomes affirmative and flow proceeds to step 214 to examine if the end of data is reached. If not, flow returns to step 202 to read the next four data bits after the shift register 1 is shifted by an amount corresponding to the number of data bits converted in the immediately preceding conversion process. If the sub-conversion table 120 was used in the preceding conversion process, the shift register 1 is shifted by four bits. If the main conversion table 110 was used, the shift register 1 is shifted by two bits.

When the end of data is reached (step 214), flow proceeds to step 231 to check to see if DSV control bit is null. If so, flow proceeds to the end of routine. If not, flow proceeds to subroutine consisting of steps 232, 233, 234 to determine the value of the current DSV control bit according to the relative magnitudes of the DSV1 and DSV2. Steps 232, 233 and 234 correspond in significance to steps 226, 227 and 228 as they determine the value of a DSV control bit. Therefore, if it is determined at step 231 that the DSV control bit is other than null, the absolute values of DSV1 and DSV2 are compared with each other at step 232 to determine their relative magnitudes. If |DSV1| is smaller than |DSV2|, flow proceeds to step 233 in which "1" is set to the current DSV control bit and POL1 is copied to POL2 and DSV1 is copied to DSV2. If |DSV1| is equal to or greater than |DSV2|, flow proceeds to step 234 in which "0" is set to the current DSV control bit and POL2 is copied to POL1 and DSV2 is copied to DSV1. In this manner, the d.c. content of the channel bit stream approaches zero If a 22-bit input stream of "01. 00. 11. 1000. 11. 10. 1001. 0001" is supplied to the shift register 1, as shown in FIG. 4, these data bits will be converted to a 33-bit output stream of "100. 101. 010. 001000. 101. 001. 010000. 100000" and stored in the buffer 6. In the illustrated example, the 17th bit position of the channel bit stream is set as the position of a DSV control bit. If this DSV control bit is the first to occur in the channel bit stream, the status of the current DSV control bit is null. Hence, the decision at step 225 is affirmative at this point of time and the current DSV control bit changes from the status of null to the status of next DSV control bit (step 229). The binary 1 of the 17th bit position is set as a temporary value in the buffer 6. If there is no DSV control bit that follows the DSV control bit of the first occurrence, the binary of this DSV control bit position is finally determined, at the end of data bit stream, according to the DSV1 and DSV2 parameters derived from the channel bits that precede the end point of data. Therefore, if |DSV1| is smaller than |DSV2|, the DSV control bit is unaltered at step 233, allowing the 010 code word (detected at step 222) to be transmitted intact. If |DSV1| is equal to or greater than |DSV2|, the DSV control bit of the second occurrence is reset to binary 0 at step 234, causing a 000 code word to be transmitted, instead of the 010 code word. If a second DSV control bit appears after the first DSV control bit before the end of data, steps 226, 227 and 228 are performed to finally determine the binary of the first DSV control bit and the binary of the second DSV control bit is finally determined at the end of data.

Figure 5:
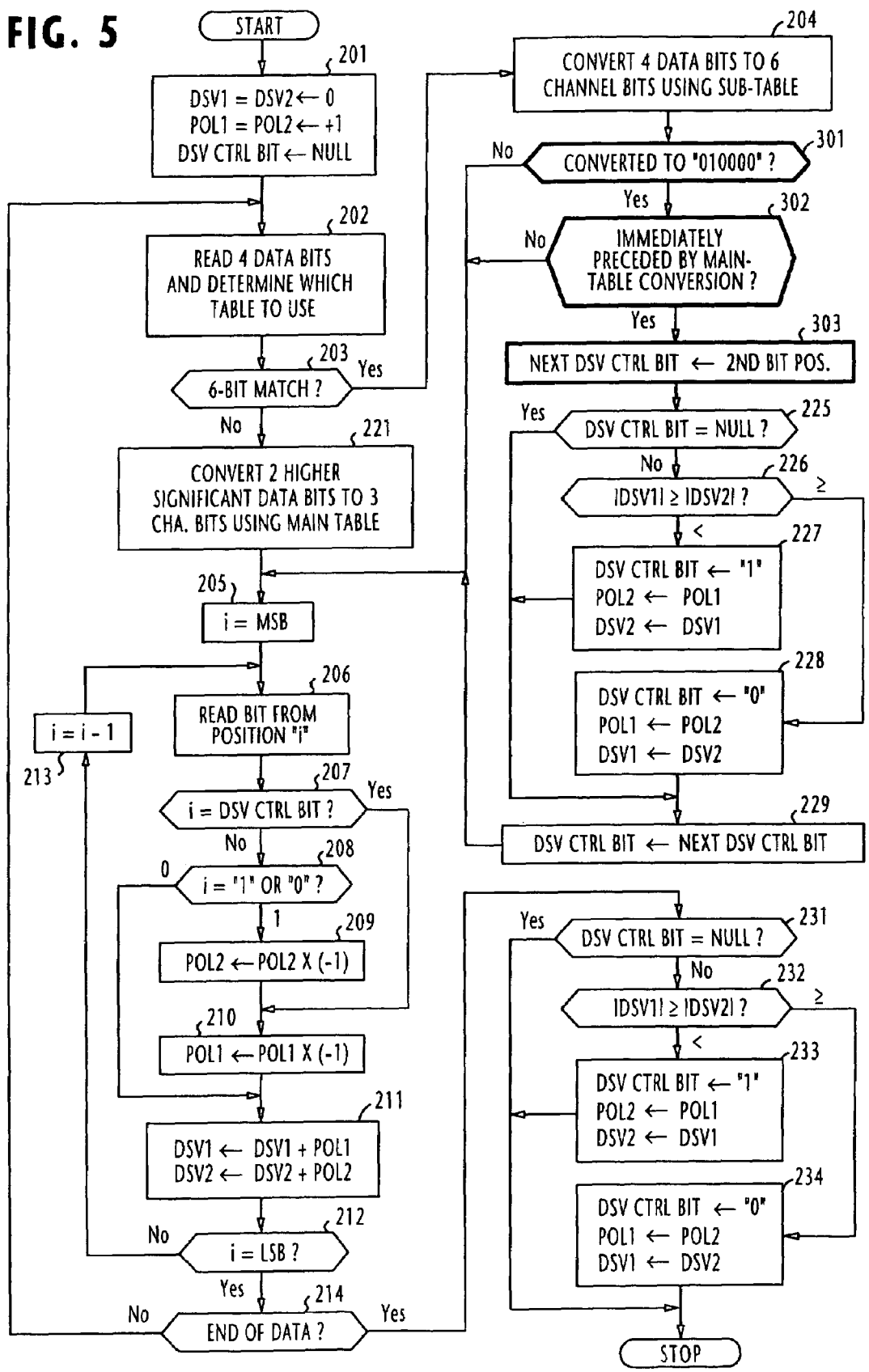
FIG. 5 is a flowchart of the operation of the data modulation apparatus according to a modification of the first embodiment of the invention.

The first embodiment of the present invention can be modified as shown in the flowchart of FIG. 5, in which parts corresponding in significance to those of FIG. 3 are marked with the same numerals and the description thereof is omitted. In this modification, the parameter update subroutine is executed immediately following step 221, and steps 301, 302 and 303 are provided to be executed following step 204.

If the main conversion table 110 is used for data modulation (step 221), flow proceeds to step 205 to immediately perform the DSV update subroutine. If the sub-conversion table 120 is used (step 204), the DSV controller 7 proceeds to step 301 and examines the 6-bit code word to see if it matches a predetermined code word "010000". If they match, flow proceeds to step 302 to check to see if this sub-table conversion is immediately preceded by a main-table conversion. If this is the case, flow proceeds to step 303 to set the second higher significant bit position of the 6-bit code word as the next DSV control bit, and flow proceeds to step 225.

If the decision at each of steps 301 and 302 is negative, flow proceeds to step 205 to perform the DSV update subroutine.

If a 22-bit input stream of "01. 00. 11. 1000. 11. 10. 1001. 0001" is supplied to the shift register 1, these data bits will be converted to a 33-bit output stream of "100. 101. 010. 001000. 010. 001. 010000. 100000", as shown in FIG. 6, with the 23rd bit position being set as the position of a DSV control bit. If this DSV control bit is the first to occur in the channel bit stream, the status of the current DSV control bit is null. Hence, the decision at step 225 is affirmative and the current DSV control bit changes to the status of next DSV control bit (step 229). The binary 1 of the 23rd bit position is set as a temporary value. If a DSV control bit of second occurrence appears, the binary 1 of this control bit is set as a temporary value and the decision at step 225 is negative and the value of the DSV control bit at the 23rd position is finally determined at steps 227, 228 according to the DSV1 and DSV2 parameters. Therefore, if |DSV1| is smaller than |DSV2|, the DSV control bit of the 23rd position is finally determined as binary 1 (unaltered) at step 227, allowing the 010000 code word to be transmitted intact. If |DSV1| is equal to or greater than |DSV2|, the DSV control bit is reset to the binary 0 of step 228, causing a 000000 code word to be transmitted, instead of the 010000 code word. If there is no DSV control bit that follows the DSV control bit of the 23rd position, the value of DSV control bit at the 23rd position is finally determined at the end of data bit stream (steps 233, 234) according to the DSV1 and DSV2 parameters derived from the channel bits that precede the end point of data. Therefore, if |DSV1| is smaller than |DSV2|, the DSV control bit is unaltered at step 233 and if |DSV1| is equal to or greater than |DSV2|, the DSV control bit is reset to binary 0 at step 234.

In a second embodiment of the present invention, a main conversion 111 and a sub-conversion table 121 of FIGS. 7A, 7B are used, instead of the tables 110 and 120 of FIGS. 2A, 2B. Sub-conversion table 121 differs from the table 120 in that the three higher significant channel bits (000) of table 121 correspond to the three lower significant channel bits (000) of the previous embodiment and the three lower significant channel bits of table 121 correspond to the three higher significant bits of the previous embodiment. In this embodiment, the flowchart of FIG. 8 is used, which differs from the flowchart of FIG. 3 in that step 223 of FIG. 3 is replaced with step 401.

If the main conversion table 111 (which is the same as table 110) is used (step 203) and the two higher significant data bits of the four-bit data word are converted to a "010" code word (steps 221, 222), step 401 determines whether the following data bits coincide with a bit pattern of the sub-conversion table 121. If this is the case, flow proceeds to step 224 to set the center bit position of the 010 code word as the next DSV control bit. Otherwise, flow proceeds to step 205 for updating the DSV parameters.

Figure 9:
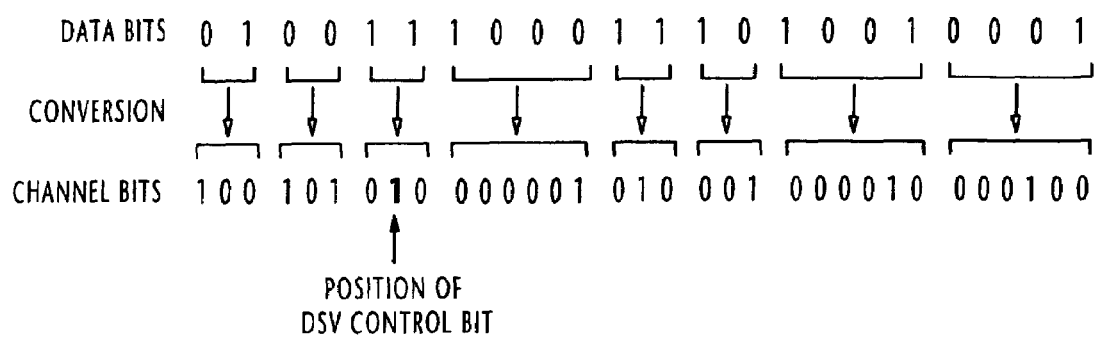
FIG. 9 is an illustration of exemplary bit sequences for describing the operation of the second embodiment of the present invention.

If a 22-bit input stream of "01. 00. 11. 1000. 11. 10. 1001. 0001" is supplied to the shift register 1, these data bits will be converted to a 33-bit output stream of "100. 101. 010. 000001. 010. 001. 000010. 000100", as shown in FIG. 9, with the eighth bit position of the channel bit stream being set as the position of a DSV control bit. The binary 1 of this DSV control bit is set as a temporary value and finally determined at the time a succeeding DSV control bit appears in the channel bit stream and hence steps 226, 227, 228 are executed, or at the end of data bit stream when steps 232, 233, 234 are executed.

Figure 8:
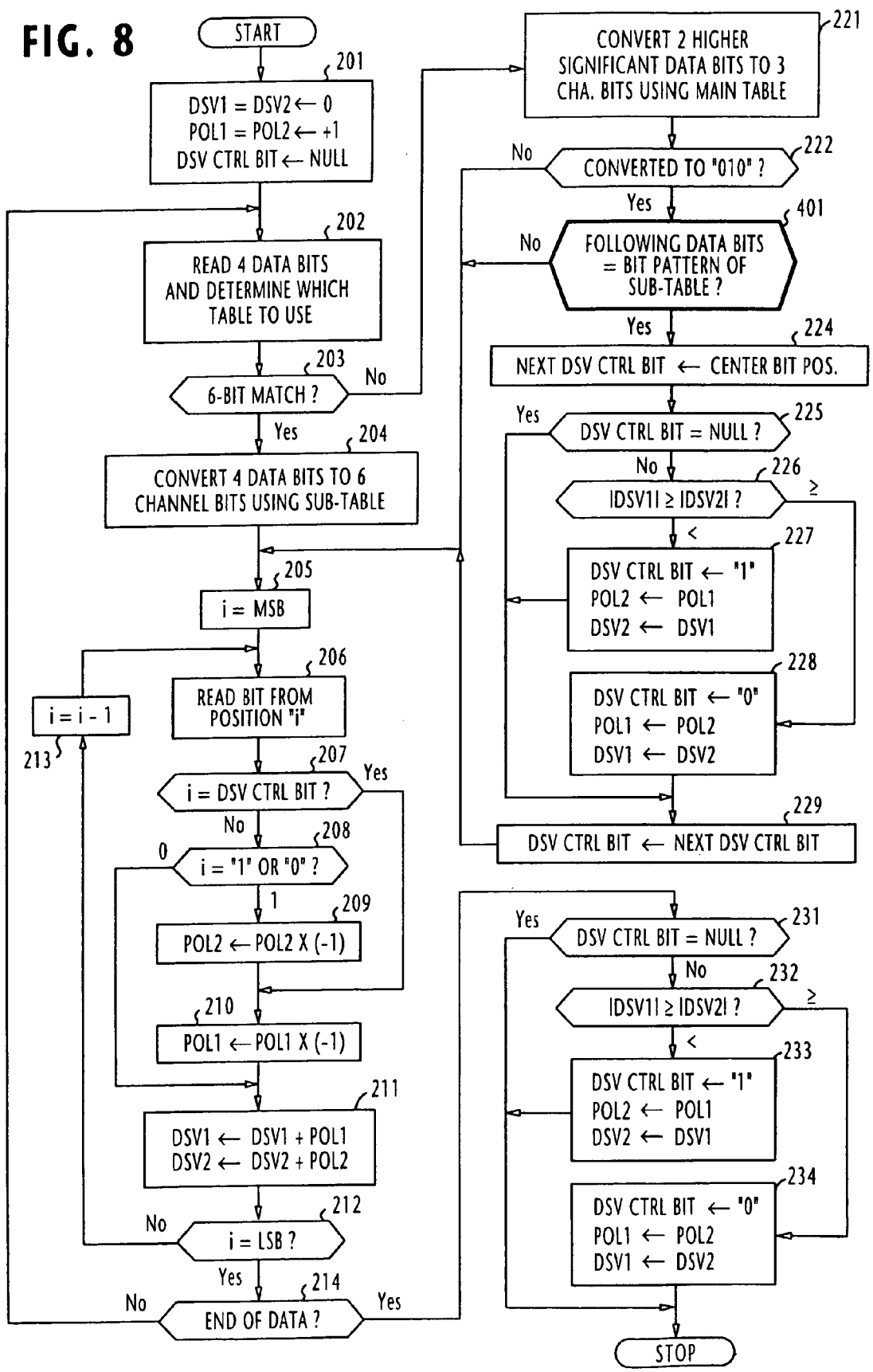
FIG. 8 is a flowchart of the operation of the data modulation apparatus according to the second embodiment of the invention.
Figure 10:
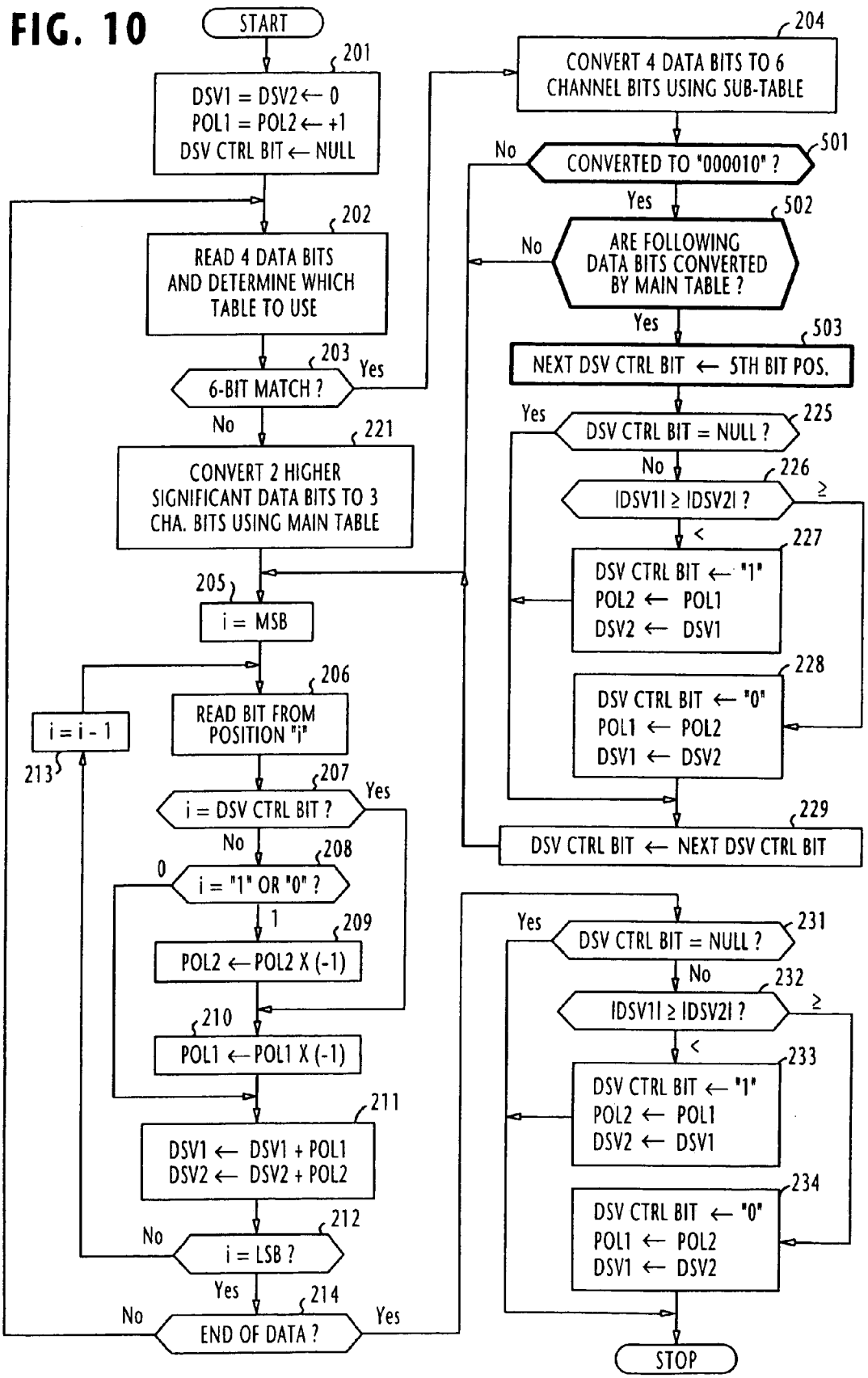
FIG. 10 is a flowchart of the operation of the data modulation apparatus according to a modification of the second embodiment of the invention.

The second embodiment of the present invention can be modified as shown in the flowchart of FIG. 10, in which parts corresponding in significance to those of FIG. 8 are marked with the same numerals and the description thereof is omitted. In this modification, the parameter update subroutine is executed immediately following step 221, and steps 501, 502 and 503 are provided to be executed following step 204.

If the main conversion table 111 is used for data modulation (step 221), flow proceeds to step 205 to immediately perform the DSV update subroutine. If the sub-conversion table 121 is used (step 204), the DSV controller 7 proceeds to step 501 and examines the 6-bit code word to see if it matches a predetermined code word "000010". If they match, flow proceeds to step 502 to check to see if the main table is used to convert the following data bits. If this is the case, flow proceeds to step 503 to set the fifth higher significant bit position of the 6-bit code word as the next DSV control bit, and flow proceeds to decision step 225.

Figure 11:
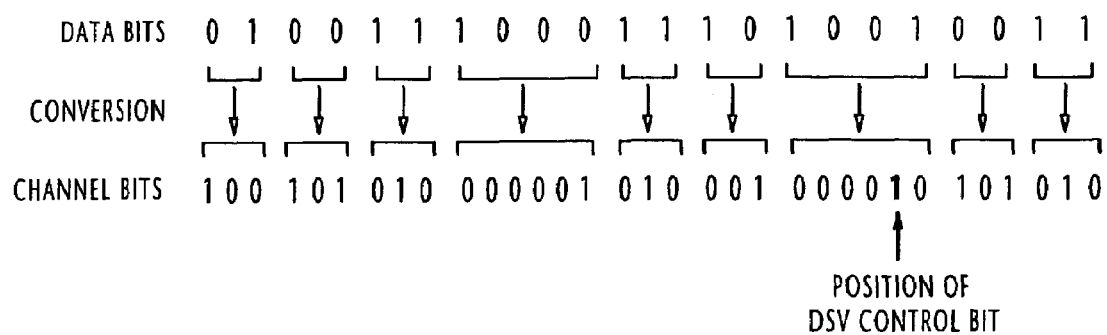
FIG. 11 is an illustration of exemplary bit sequences for describing the operation of the modification of the second embodiment.

If a 22-bit input stream of "01. 00. 11. 1000. 11. 10. 1001. 00. 11" is supplied to the shift register 1, these data bits will be converted to a 33-bit output stream of "100. 101. 010. 000001. 010. 001. 000010. 101. 010", as shown in FIG. 11, with the 26th bit position of the channel bit stream being set as the position of a DSV control bit. The binary 1 of this control bit is set as a temporary value, and finally determined at the instant a subsequent DSV control bit appears and hence steps 226, 227, 228 are executed, or at the end of data bit stream and steps 232, 233, 234 are executed.

The first embodiment of the present invention can also be implemented using a conversion table 130 as shown in FIG. 12. In the table 130, the symbol "X" indicates a "don't-care" bit, i.e., it can assume the value of either "0" or "1", and the symbols S0 and S1 are status indicators to be selected by a table access module 12. Data and channel bits in the conversion table 130 are organized into two groups according to the status indicators S0 and S1 of previous state and into three groups according to the status indicators S0, S1 and S0 of next state. Further, the channel bits of the S0 current state and the S1 next state correspond to the first three bits of 6-bit code words stored in the sub-conversion table 120 (FIG. 2B) and the channel bits of the S1 of the previous state correspond to the second three bits of the 6-bit code words.

Table access module 12 operates as an interface to the conversion table 130 and receives four parallel data bits from a shift register 11, which is always shifted two bits at a time. The four data bits from the shift register 11 are equally divided into higher and lower significant data bits in the conversion table 130. Since data bits in the shift register 11 are shifted two bits at a time, the higher significant bits of a given four-bit data word become the lower significant bits of a subsequent four-bit data word. Table access module 12 uses all four data bits of a data word from the shift register 11 to detect a corresponding 3-bit code word mapped in the table 130 and converts the two higher significant bits of this 4-bit data word to the corresponding 3-bit code word. In response to the shift register 11 being shifted two bits, a 3-bit code word is delivered from the table access module 12 to a buffer 15. A series of such 3-bit code words forms a channel bit stream in which no consecutive bits 1's occur.

A next-state memory 14 is connected to the table access module 12 to store the status indicator of next state. A DSV controller 16 is responsive to the 3-bit code word and the next-state status indicator from the table access module 12 for controlling the DSV control bit of the channel bit stream stored in the buffer 15.

At the instant an input data bit stream is supplied to the data modulation apparatus, the table access module 12 is set in an initial state in which it selects the status indicator S0.

Figure 13:
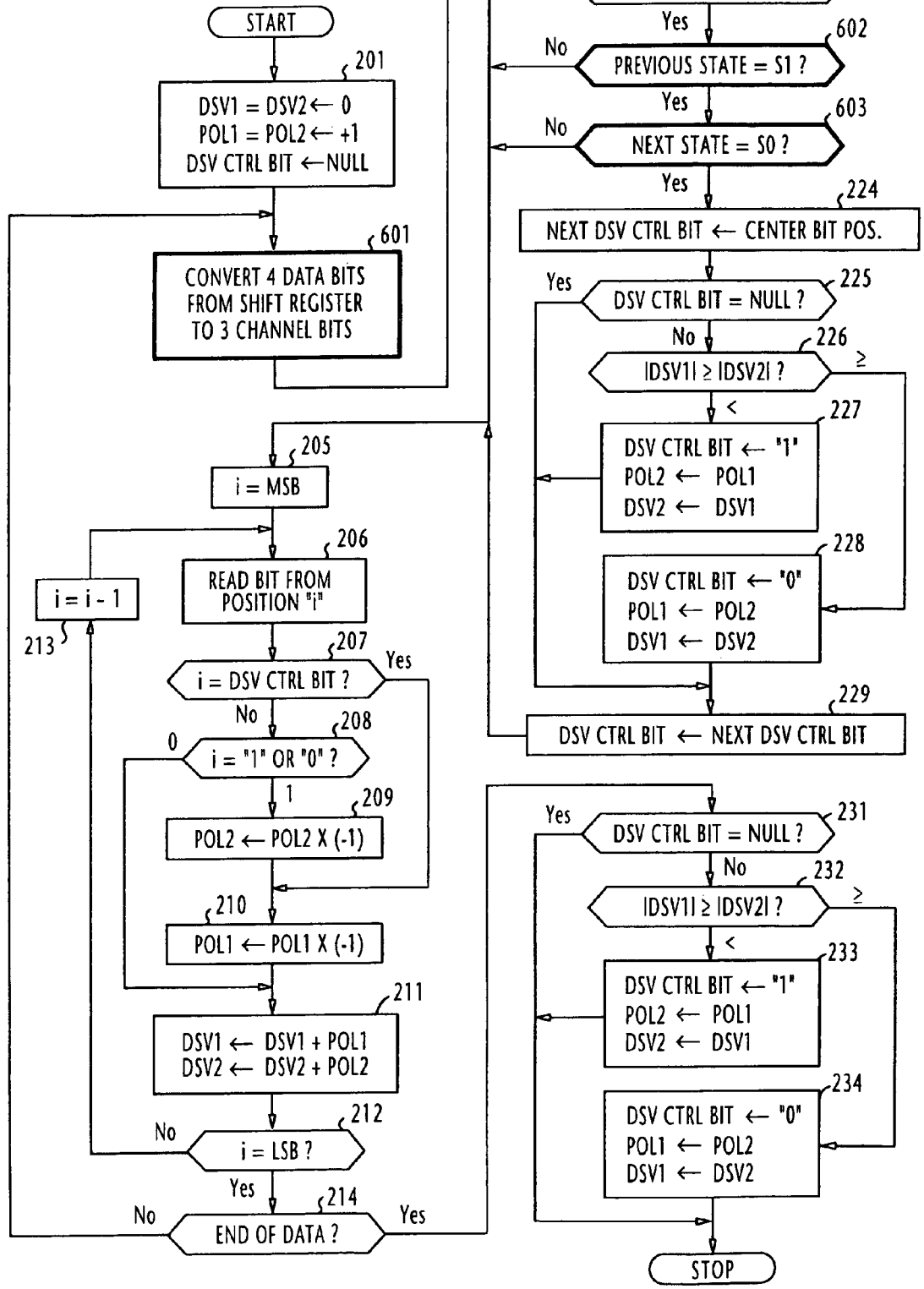
FIG. 13 is a flowchart of the operation of the apparatus of FIG. 12.

The operation of the data modulation apparatus of FIG. 12 proceeds according to the flowchart of FIG. 13 in which parts corresponding in significance to those in FIG. 3 are marked with the same numerals and the description thereof is omitted. When initialization step 201 is performed, flow proceeds to step 601 to convert four parallel data bits from the shift register 11 into a 3-bit code word. Since the access module 12 is initially set in the S0 state, the status indicator S0 is used a search key for converting the four data bits to three channel bits other than "000". Depending on the group of the converted channel bits, the next state is selected and supplied through the access module 12 to the memory 14. Following step 601, step 222 is executed to determine if the converted channel bits are "010". At step 602, the apparatus makes a decision as to whether the previous state is S1. If the previous state is S1, flow proceeds to step 603 to check to see if the next state is S0. Therefore, the decision of step 602 in FIG. 13 is equivalent to the decision of step 223 of FIG. 3 which determines whether the sub-conversion table was used for the immediately preceding conversion. Further, the affirmative decisions at step 222 and 603 combined are equivalent to the decision that the "010" of main conversion table was previously used. If the decision at step 603 is affirmative, flow proceeds to step 224 to set the center bit of "010" code word as the position of a DSV control bit. Otherwise, flow proceeds from step 603 to step 205.

In the previous embodiments, code words "000" and "000000" are used for replacing the code words "010" and "010000" when their DSV control bit is altered to "0" bit. As a result, a long string of consecutive zero's can occur often compared to the prior art. For example, in the case of the first embodiment, a data bit stream "0001111011" is converted to a channel bit stream "1000000X0001010", where the symbol X represents a DSV control bit. If the binary of the DSV control bit is finally set equal to "0", binary 0 appears ten times in sequence. In the first embodiment, binary 0 never appears consecutively eleven times or more. Hence, the run length constraint of the first embodiment is (1, 10). The same applies to the other embodiments. Therefore, when the (1, 10) run length code is recorded using the NRZI format, a recording pattern with the length equal to or greater than 2T and equal to or smaller than 11T appears, where T is the length of a channel bit.

If it is desired to constrain the maximum number of zero's in the channel bit stream to "7, 8 or 9", the DSV controller may be modified in such a manner that it monitors the channel bit stream in the buffer 6 for detecting a bit sequence having a predetermined number of consecutive zero's which has been formed due to the replacement of the detected code "010" with the substitute code word "000" (i.e., in the case of the first embodiment). If such an all-zero bit sequence is detected, the DSV controller restores the original code word "010". Since this restoration results in a candidate DSV control bit being discarded, the d.c. content of the channel bit stream may somewhat be sacrificed. However, the length of a recorded "mark" is constrained and a greater freedom is given to selecting a synchronization pattern which will be described later.

In the case of the first embodiment, a data bit stream "0011001100 . . . " is converted to a channel bit stream "101010101010101 . . . ". This results in a long series of 2T-bit patterns on a recording disc. Due to inter-symbol interference, difficulty arises to extract clock information from such a long series of 2T-bit patterns. However, this problem can be avoided by replacing a 2T-bit pattern "X01. 010.101. 010. 10X" with a substitute bit pattern "X01. 000.000.000. 10X" since it can be shown that the code word "000" never occurs consecutively three times in any channel bit stream.

Figure 14:
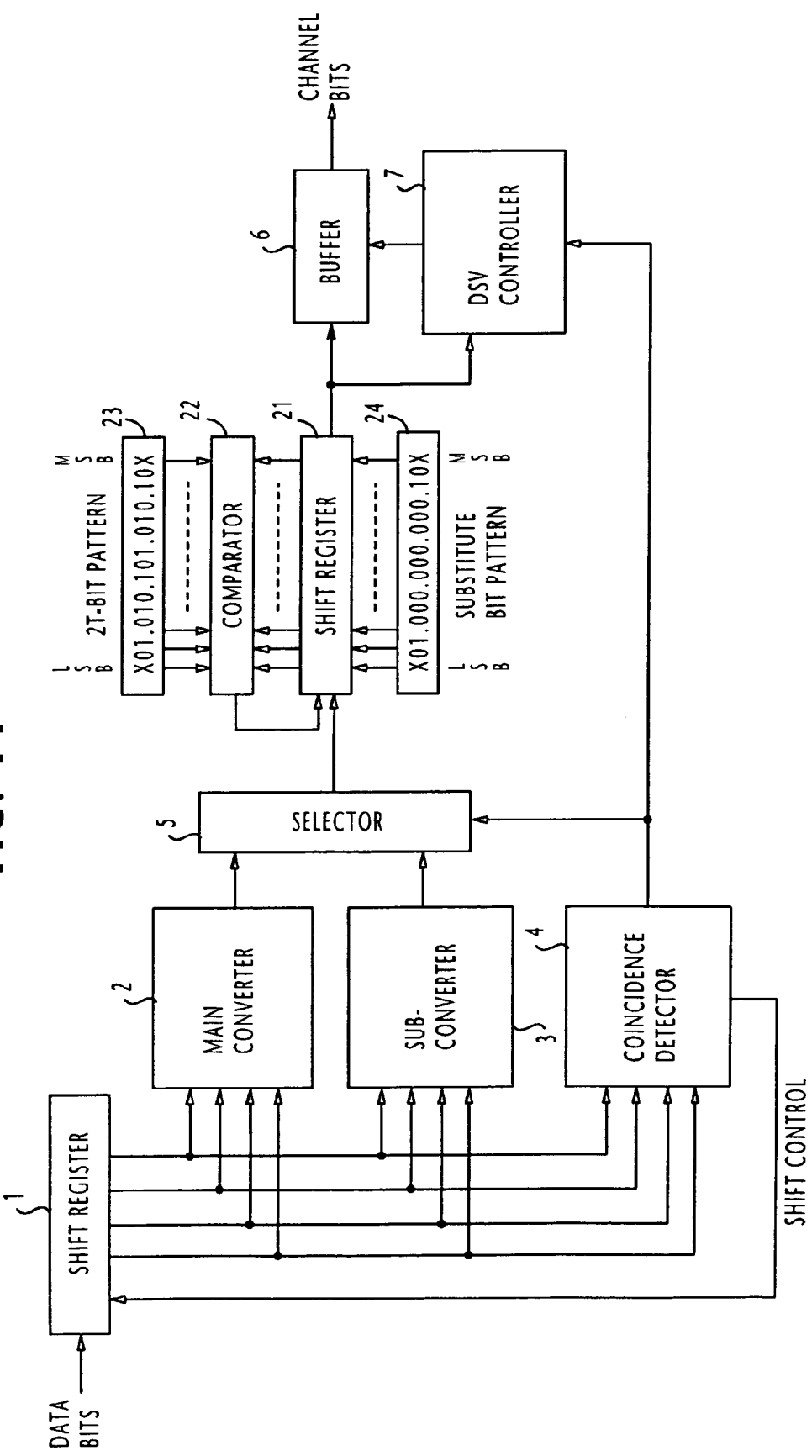
FIG. 14 is a block diagram of the data modulation apparatus according to another modification of the first embodiment of the present invention, in which 2T periodic channel bit patterns are replaced with zero-bit sequence.

A data modulation apparatus, shown in FIG. 14, is to implement this bit pattern replacement scheme. In FIG. 14, parts corresponding in significance to those in FIG. 1 are marked with the same numerals. The apparatus additionally includes a shift register 21 connected between the selector 5 and the buffer 6. The output of selector 5 is stored in the shift register 21 and shifted along three bits at a time to the buffer 6. The internal stages of shift register 21 are connected to a comparator 22. Comparator 22 constantly monitors the shift register 21 for detecting when its bit pattern matches a 2T-bit pattern "X01. 010. 101. 010. 10X" stored in a memory 23. A substitute bit pattern "X01. 000. 000. 000. 10X" is stored in a memory 24 connected to the shift register 21. When the comparator 22 detects a match between the shift register 21 and the memory 23, the comparator commands the shift register 21 to replace its contents with the bit pattern of memory 24. Instead of the 2T-bit pattern, the substitute bit pattern is forwarded to the buffer 6 as well as to the DSV controller 7. Since it can be shown that a DSV control bit never appears in the substitute bit pattern, it is not necessary to produce a particular code for indicating such replacement. DSV controller 7 operates in the same way as that described previously.

Figure 15A:
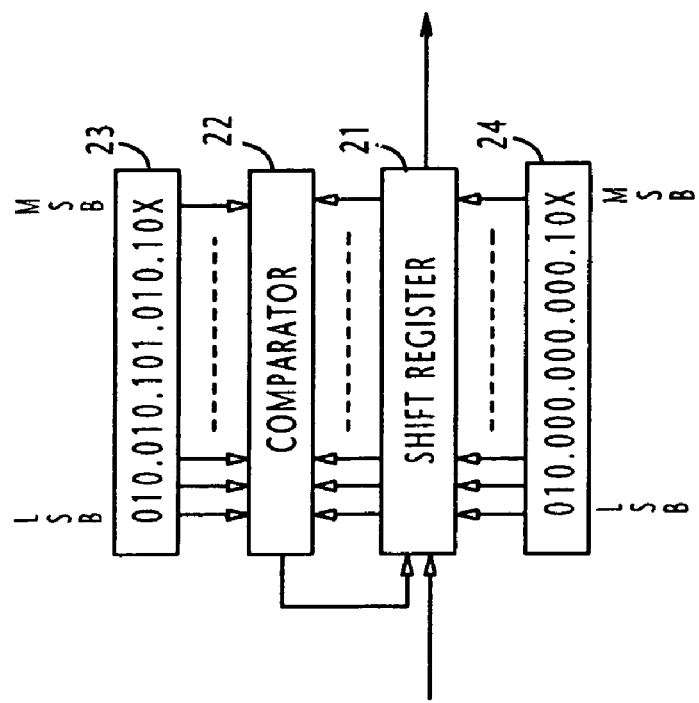
FIGS. 15A, 15B are block diagrams of the modifications of FIG. 14.
Figure 15B:
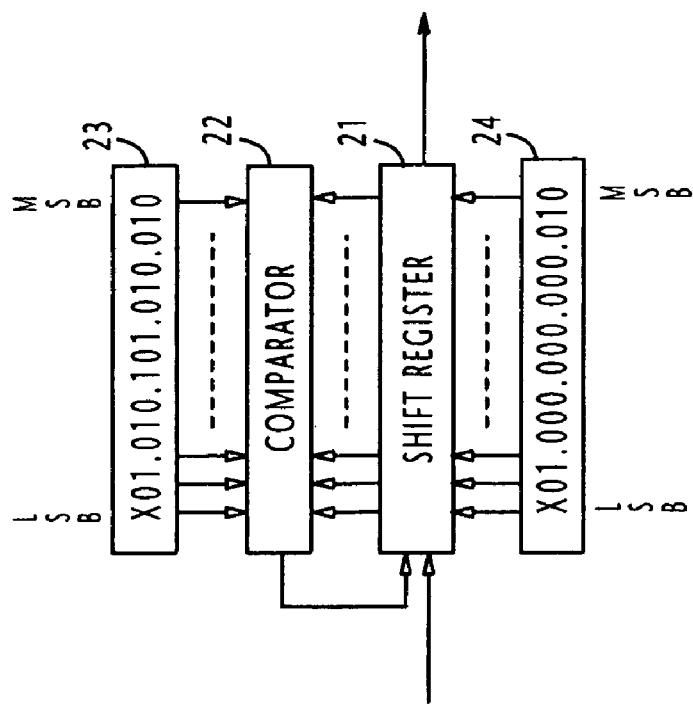

If it is desired that the substitute bit pattern includes a maximum of 10 consecutive zeros, rather than 9, a substitute bit pattern of "010. 000. 000. 000. 10X" may be used to replace a 2T-bit pattern of "010. 010. 101. 010. 10X" as shown in FIG. 15A. Additionally, a substitute bit pattern of "X01. 000. 000. 000. 010" may be also used to replace a 2T-bit pattern of "X01. 010. 101. 010. 010" as shown in FIG. 15B. In this way, the number of 2T-bit patterns that occur consecutively can be constrained to the maximum of 6.

A special synchronizing bit sequence may be inserted at regular intervals in a channel bit stream to allow a data demodulation apparatus to distinguish the boundary between successive channel bit streams or regain synchronism when it loses synchronization due to lack of sufficient clock information.

Figure 16:
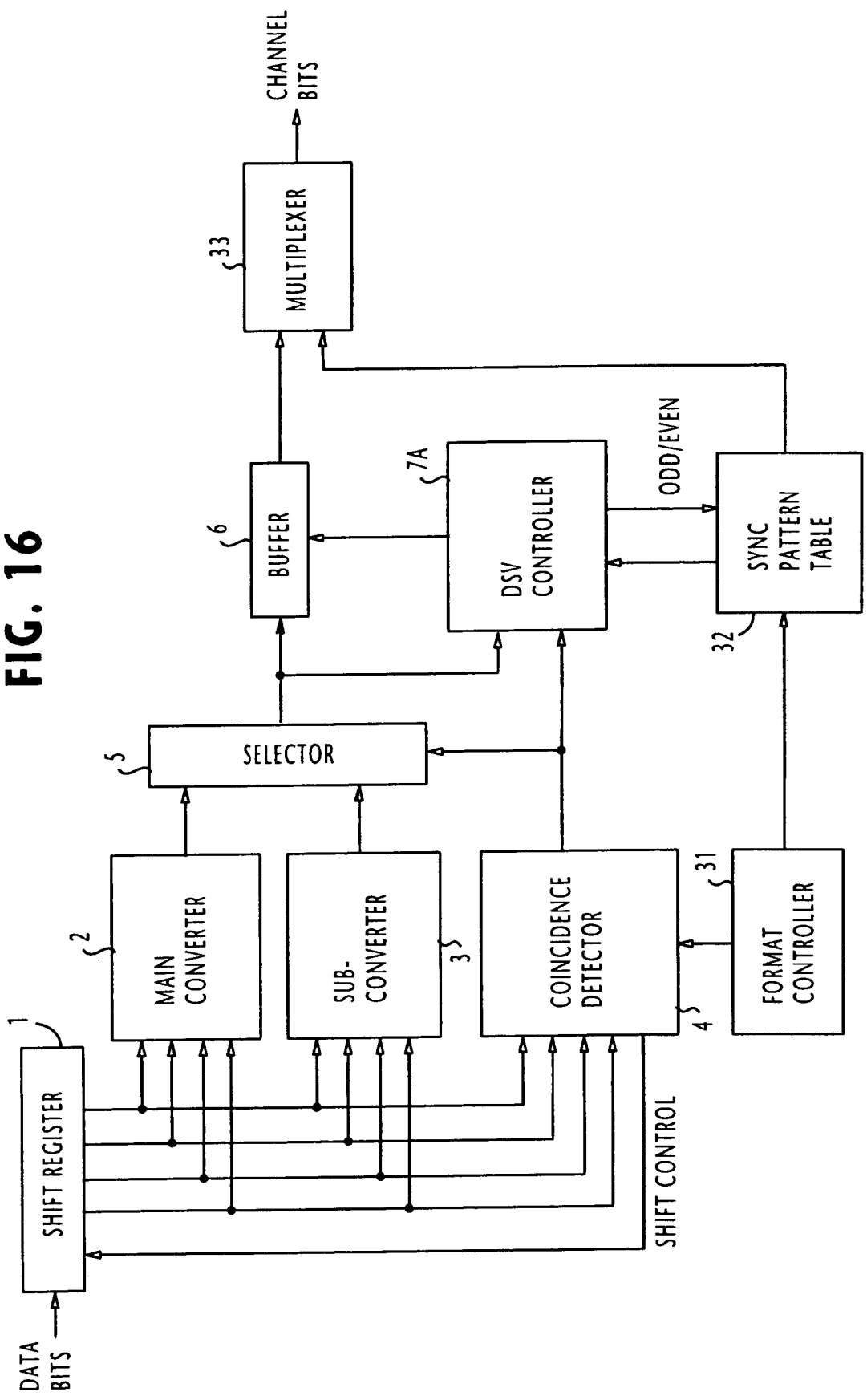
FIG. 16 is a block diagram of a data modulation apparatus in which synchronizing bit streams are multiplexed with channel bit streams.

The data modulation apparatus of FIG. 1 is modified as shown in FIG. 16 to implement a synchronized encoder/decoder system. In this modification, the data modulation apparatus includes a format controller 31, a sync pattern table 32 and a multiplexer 33. Format controller 31 supplies a timing signal to the coincidence detector 31 for indicating the timing of a 24-bit sync pattern to be inserted to the channel bit stream. Coincidence detector 31 determines the position of the channel bit stream where the sync pattern will be inserted. In order to prevent a 6-bit code word from being separated by a sync pattern, the coincidence detector 31 controls the selector 5 to select the output of main converter 2 regardless of the instantaneous value of the input data bit stream.

As shown in FIG. 17, eight 24-bit sync patterns SY0~SY7 of even-numbered 1's and eight 24-bit sync patterns SY0~SY7 of odd-numbered 1's are stored in the table 32. Each sync pattern comprises a header portion of 15-bit equal pattern "010. 000. 000. 000. 001" and a tail portion of 9-bit unique pattern. Since the sync patterns of FIG. 17 indicate that their header and trailer channel bits are both "0", the channel bit stream satisfies its run length constraint even though the output of main converter 2 is selected both at the beginning and ending points of a sync pattern.

Additionally, the format controller 31 supplies a command signal to the sync pattern table 32 to specify one of a plurality of 24-bit sync patterns (SY0~SY7) according to the amount of offset from the starting point of a sector on a recording disc.

In response to the command signal from the format controller, the sync pattern table 32 supplies the DSV controller 7A with even- and odd-numbered sync patterns specified by the command signal. DSV controller 7A uses the sync patterns to update the DSV1 and DSV2 parameters. Further, according to the relative values of the updated DSV1 and DSV2, the DSV controller 7A determines the value of the preceding DSV control bit and selects one of the even- and odd-numbered sync patterns, as illustrated in detail in FIGS. 18 and 19. DSV controller 7A instructs the sync pattern table 32 to supply the selected pattern to the multiplexer 33 where it is multiplexed with channel bit streams from the buffer 6. Coincidence detector 4 further supplies a timing control signal to the DSV controller 7A that indicates the timing for an interrupt routine performed according to the flowchart of FIG. 18.

Figure 18:
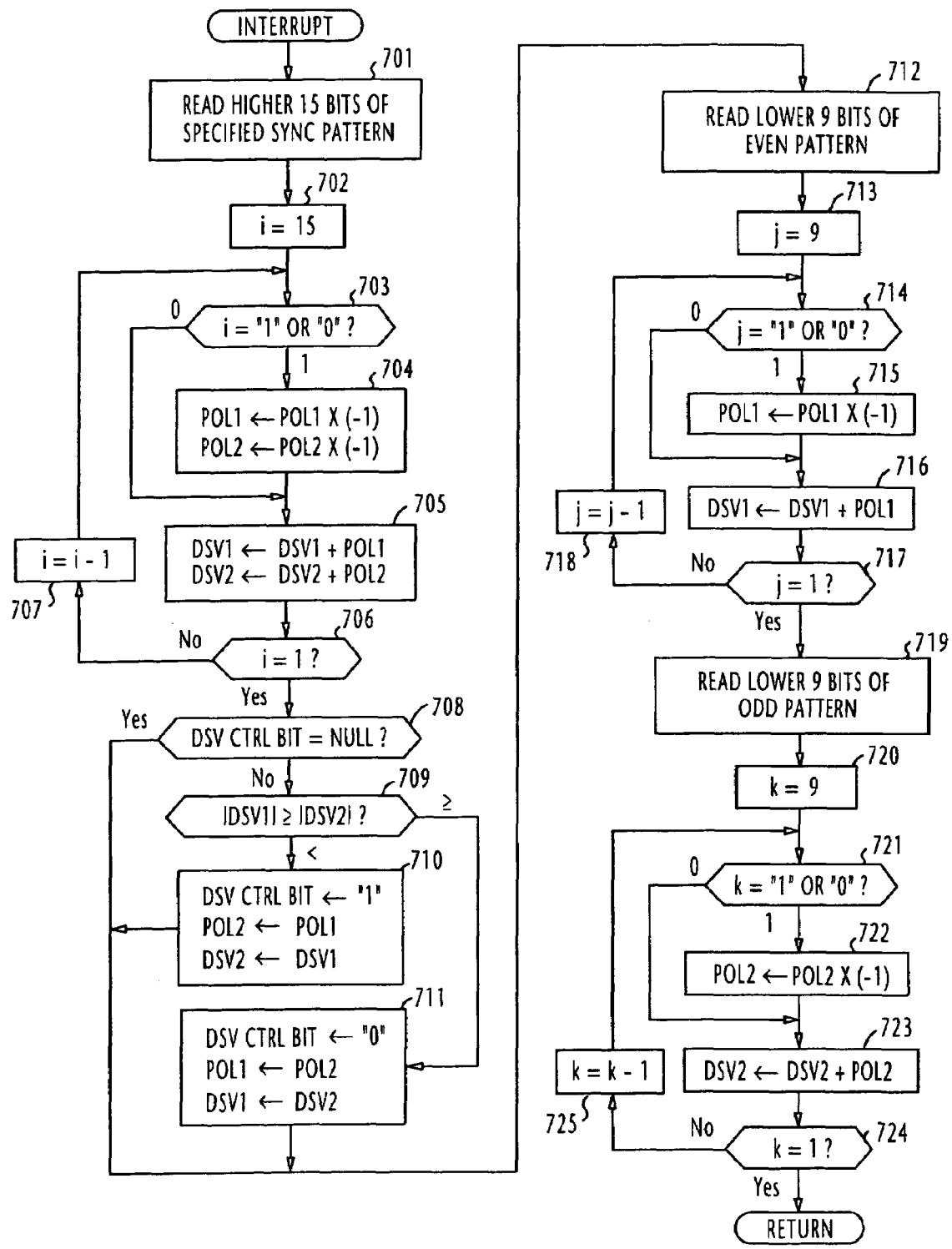
FIGS. 18 and 19 are flowcharts associated with the data modulation apparatus of FIG. 16.

In FIG. 18, the DSV controller 7A performs an interrupt routine on the sync patterns supplied from the table 32 in response to the timing control signal supplied from the coincidence detector 4 in order to update the DSV parameters. Note that this timing control signal does not indicate the actual timing for multiplexing a 24-bit sync pattern with the channel bit stream by the multiplexer 33, but it is the timing for determining the DSV and POL parameters for a sync pattern to be subsequently multiplexed with the channel bit stream. Therefore, a 24-bit sync pattern is not multiplexed until an odd/even decision is made by the routine of FIG. 19.

The interrupt routine of FIG. 18 begins with step 701 to read the higher significant 15 bits of the sync patterns and sets a variable "i" to "15" (step 702). At step 703, the DSV controller reads the value of the i-bit position of the 15-bit synchronizing sequence and determines whether it is "1" or "0". If the binary at i-th bit position is "1", the polarity parameters POL1 and POL2 are reversed in polarity at step 704 and the DSV1 and DSV2 parameters are respectively summed with POL1 and POL2 at step 705. If the binary at i-th bit position is "0", flow proceeds to step 705 to update the DSV1 and DSV2 parameters with non-reversed POL1 and POL2 parameters. The variable "i" is decremented by one at step 707 to repeat the process until the variable equals unity (step 706).

At step 708, the DSV controller 7A examines the status of DSV control bit. If the status of the current DSV control bit is null, flow proceeds to step 712. Otherwise, flow proceeds to step 709 to determine the relative values of DSV1 and DSV2. If |DSV1| is smaller than |DSV2|, flow proceeds to step 710 to set "1" to the preceding DSV control bit and copy POL1 to POL2 and copy DSV1 to DSV2. If |DSV1| is equal to or greater than |DSV2|, flow proceeds to step 711 to set "0" to the preceding DSV control bit and copy POL2 to POL1 and copy DSV2 to DSV1, and advances to step 712.

At step 712, the lower significant 9 bits of even-numbered sync pattern are read and a variable "j" is set to "9" (step 713). Parameters POL1 and DSV1 are updated using the 9-bit even-numbered bit sequence. If the binary of bit position "j" is "1" (step 714), POL1 is reversed (step 715) and DSV1 is updated with the reversed POL1 (step 716). If the binary of bit position "j" is "0" (step 714), DSV1 is updated with non-reversed POL1 (step 716). The variable "j" is decremented by one at step 718 to repeat the process until the variable "j" equals unity (step 706).

DSV controller 7A proceeds to step 719 to read the lower significant 9 bits of the odd-numbered pattern and sets a variable "k" to "9" (step 720). In this case, the parameters POL2 and DSV2 are updated using the 9-bit odd-numbered bit sequence. If the binary of bit position "k" is "1" (step 721), POL2 is reversed (step 722) and DSV2 is updated with the reversed POL2 (step 723). If the binary of bit position "k" is "0" (step 721), DSV2 is updated with non-reversed POL2 (step 723). The variable "k" is decremented by one at step 725 to repeat the process until the variable "k" equals unity (step 724). When the DSV controller 7A makes an affirmative decision at step 724, it returns to the main routine.

Figure 19:
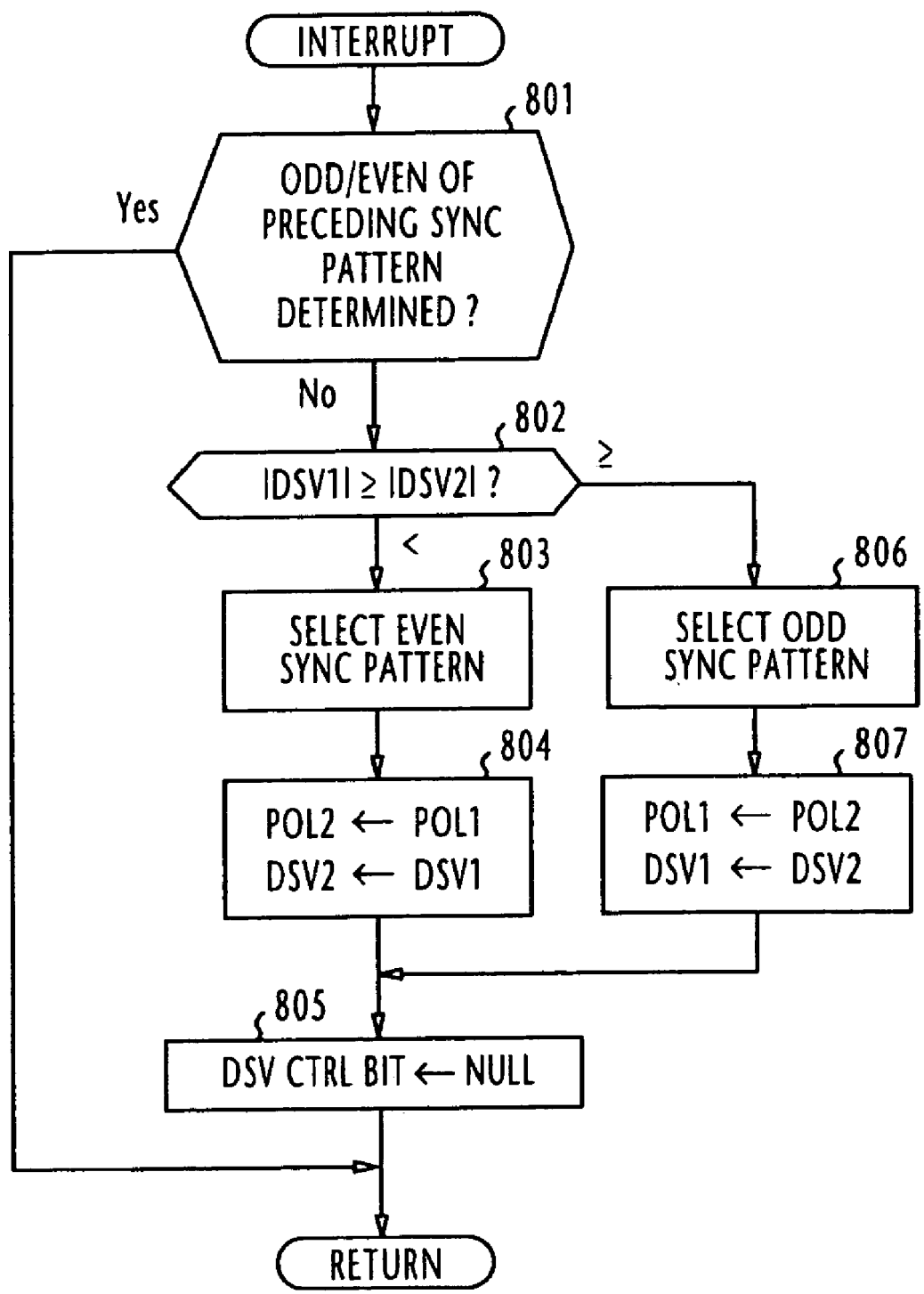

DSV controller 7A selects one of the odd- and even-numbered bit sequences according to an interrupt routine illustrated in FIG. 19. This interrupt routine is performed at the instant immediately prior to each decision step (i.e., 225, 231, 708), where the decision is made as to whether the status of the DSV control bit is null.

At step 801, the controller 7A checks to see if decision has been made of an immediately preceding 24-bit sync pattern as to which of the odd- and even-numbered patterns should be used. If the odd/even decision has been made of a sync pattern which precedes the current odd/even decision routine, it is determined that there is no outstanding sync pattern and flow returns to the point of the main routine where it was interrupted. If the odd/even decision has still not been made of the preceding sync pattern, flow proceeds to step 802 to determine the relative values of the DSV1 and DSV2 parameters which were previously determined by FIG. 18. If |DSV1| is smaller than |DSV2|, flow proceeds to step 803 to select the even-numbered sync pattern and copy POL1, DSV1 to POL2, DSV2, respectively (step 804). At step 805, the DSV control bit is set to the null state, and returns to the starting point of the main routine. If |DSV1| is equal to or greater than |DSV2|, flow proceeds to step 806 to select the odd-numbered sync pattern and copy POL2, DSV2 to POL1, DSV1, respectively (step 807), and proceeds to step 805.

When the DSV controller 7A makes an odd/even decision, it commands the sync pattern table 32 to supply the selected 24-bit sync pattern to the multiplexer 33.

It is seen that there is a difference between the times at which FIGS. 18 and 19 are executed. However, this timing difference is absorbed in the buffer 6. Each time a new channel bit stream is entered to the buffer 6, DSV calculation proceeds for multiplexing a 24-bit sync pattern at periodic intervals. The actual multiplex timing of a sync pattern is not finally determined until a next DSV control bit is determined or the multiplex timing of a next sync pattern is temporarily determined by the format controller 31. Until a sync pattern is finally determined, a channel bit stream is stored in the buffer 6. After transmitting the sync pattern, the stored channel bit stream is delivered from the buffer 6.

Figure 20:
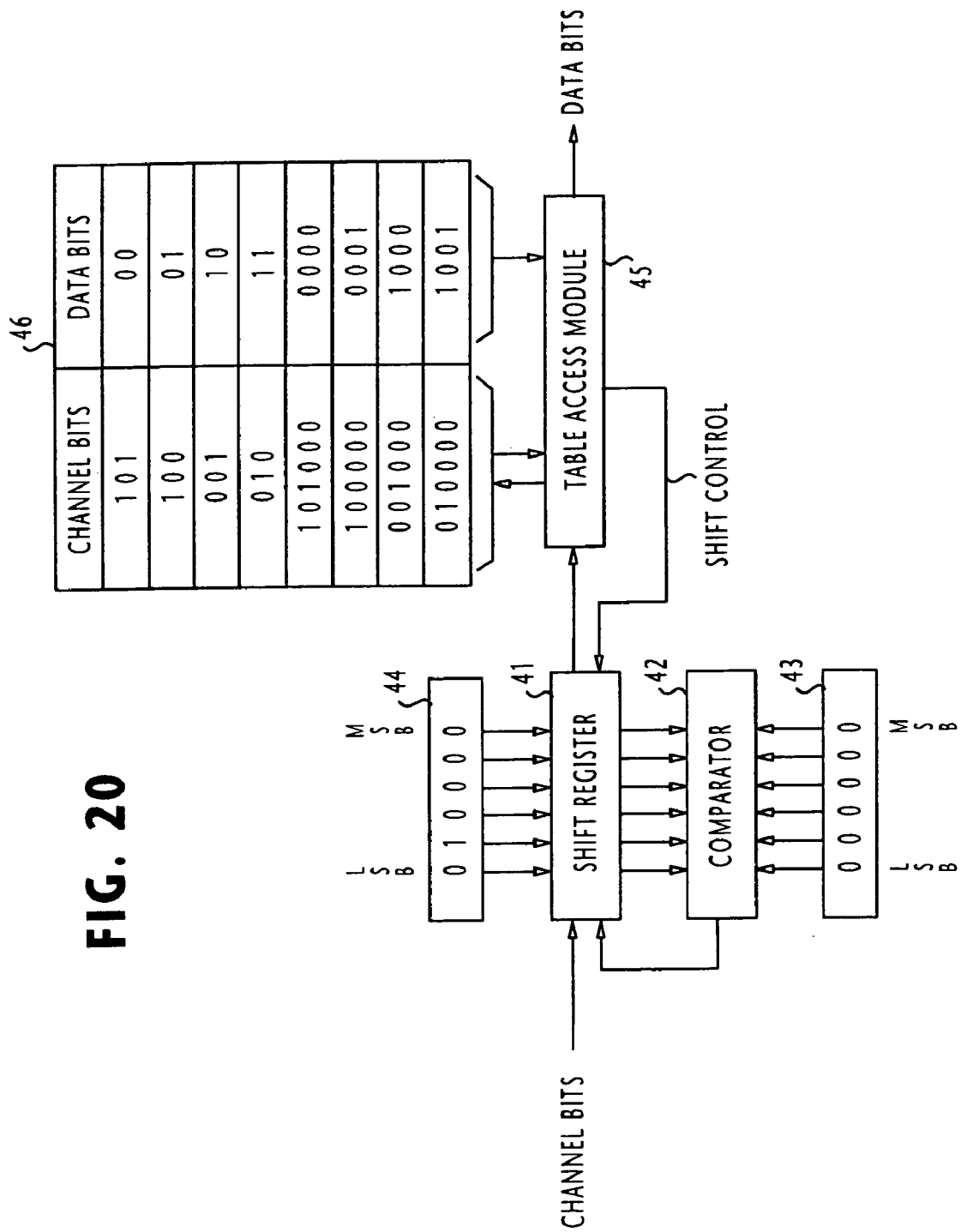
FIG. 20 is a block diagram of a data demodulation apparatus of the present invention.

FIG. 20 is a block diagram of a data demodulation apparatus of the present invention. In the case of the first embodiment of the present invention, for example, the bit sequence "000. 000" is transmitted, instead of "000.010", when the DSV control bit (i.e., the center bit of "010") is set to "0"when it is finally determined. In this case, the data demodulation apparatus must replace the transmitted bit sequence "000. 000" with a bit sequence "000. 010".

Therefore, the data demodulation apparatus for use with the first embodiment of the present invention comprises a shift register 41 for receiving an input channel bit stream. A comparator 42 monitors the shift register 41 for detecting when a bit sequence "000. 000" has arrived by comparing the shift register contents with a "000. 000" bit sequence stored in a memory 43. If they match, the comparator 42 instructs the shift register 41 to replace the stored bit sequence with a bit sequence "000. 010" stored in a memory 44.

The output of shift register 41 is supplied to a table access module 45 to access a conversion table 46. Conversion table 46 maps 3-bit code words to corresponding 2-bit data words and 6-bit code words to corresponding 4-bit data words.

Shift register 41 is shifted six bits at a time when a 6-bit code word was converted in the table access module 45 during the immediately preceding process, and shifted three bits at a time if the higher three bits of an incoming 6-bit code word are not followed by a 3-bit sequence "000".

If the data modulation apparatus of FIG. 14 is used, a bit sequence "000. 000. 000" would be stored in the memory 44 for comparison with the input channel bit stream. If the same sequence is detected in the channel bit stream, it is replaced with a substitute bit sequence "010. 101. 010" which would be stored in the memory 43.

The channel bit stream of the present invention has the same coding rate 2/3 as the (1, 7) modulation and the number of zero's in the channel bit sequence is constrained in the range between 1 and 10. As shown in FIG. 22, the power spectrum of present invention compares favorably with that of the (1, 7) modulation. Compared with the prior art, it is seen that in the present invention more than 20 dB is suppressed in power density at normalized frequency 0.0001 (i.e., 1.0E-4). The low-frequency components of signals reproduced from a recording disc are reduced significantly. Off-track variations due to recorded signal patterns can be avoided.

What is claimed is:

1. A data modulation method comprising the steps of:
   a) converting each N-bit data word of a plurality of N-bit data words of a data bit stream to a corresponding M-bit code word of a plurality of M-bit code words to form a channel bit stream, where the integer M is greater than the integer N;
   b) determining a digital sum value of said channel bit stream;
   c) detecting a bit sequence of a predetermined pattern in the channel bit stream; and
   d) replacing a bit "1" of the bit sequence in the channel bit stream with a bit "0" if the replacement results in said digital sum value approaching zero.

2. A data modulation method comprising the steps of:
   a) mapping a plurality of 4-bit data words to a plurality of 3-bit code words in a memory;
   b) segmenting a data bit stream into a plurality of 4-bit data words by successively shifting two bits at a time;
   c) converting higher significant two bits of each 4-bit data word to a 3-bit code word correspondingly mapped to the 4-bit data word in said memory and converting lower significant two bits of the 4-bit data word as higher significant two bits of a subsequent 4-bit data word to a 3-bit code word correspondingly mapped to said subsequent 4-bit data word so that a channel bit stream having no consecutive 1's is produced by a plurality of said 3-bit code words;

d) determining a digital sum value of said channel bit stream;

e) detecting a first predetermined one of said 3-bit code words which is consecutive with a second predetermined one of said 3-bit code words; and f) replacing the detected code word with a substitute code word "000" if the replacement results in said digital sum value approaching zero.

3. A data modulation method comprising the steps of:

mapping, in a memory, 2-bit data words "00", "01", "10" and "11" to 3-bit code words "101", "100", "001" and "010", respectively, and mapping 4-bit data words "0000", "0001", "1000" and "1001" to 6-bit code words "101000", "100000", "001000" and "010000", respectively;

segmenting a data bit stream into a plurality of 4-bit data words;

converting each of the 4-bit data words to a 6-bit code word mapped in said memory if the 4-bit data word is coincident with one of said mapped 4-bit data words and converting higher significant two bits of the 4-bit data word to a 3-bit code word mapped in said memory if the 4-bit data word is non-coincident with any of said mapped 4-bit data words so that a channel bit stream having no consecutive 1's is formed by a plurality of said 6-bit code words and a plurality of said 3-bit code words;

forming a subsequent 4-bit data word with lower significant bits of the non-coincident data word;

determining a digital sum value of said channel bit stream;

detecting a code word "010" which occurs immediately following any one of said 6-bit code words; and replacing the detected code word with a substitute code word "000" if the replacement results in said digital sum value approaching zero.

4. A data modulation method comprising the steps of:

mapping, in a memory, 2-bit data words "00", "01", "10" and "11" to 3-bit code words "101", "100", "001" and "010", respectively, and mapping 4-bit data words "0000", "0001", "1000" and "1001" to 6-bit code words "101000", "100000", "001000" and "010000", respectively;

segmenting a data bit stream into a plurality of 4-bit data words;

converting each of the 4-bit data words to a 6-bit code word mapped in said memory if the 4-bit data word is coincident with one of said mapped 4-bit data words, and converting higher significant two bits of the 4-bit data word to a 3-bit code word mapped in said memory if the 4-bit data word is non-coincident with any of said mapped 4-bit data words so that a channel bit stream having no consecutive 1's is formed by a plurality of said 6-bit code words and a plurality of said 3-bit code words;

forming a subsequent 4-bit data word with lower significant bits of the non-coincident data word;

determining a digital sum value of said channel bit stream;

detecting a code word "010000" which occurs immediately following any one of said 3-bit code words; and replacing the detected code word with a substitute code word "000000" if the replacement results in said digital sum value approaching zero.

5. A data modulation method comprising the steps of:

mapping, in a memory, 2-bit data words "00", "01", "10" and "11" to 3-hit code words "101", "100", "001" and "010", respectively, and mapping 4-bit data words "0000", "0001", "1000" and "1001" to 6-bit codewords "000101", "000100", "000001" and "000010", respectively;

segmenting a data bit stream into a plurality of 4-bit data words;

converting each of the 4-bit data words to a 6-bit code word mapped in said memory if the 4-bit data word is coincident with one of said mapped 4-bit data words, and converting higher significant two bits of the 4-bit data word to a 3-bit code word mapped in said memory if the 4-bit data word is non-coincident with any of said mapped 4-bit data words so that a channel bit stream having no consecutive 1's is formed by a plurality of said 6-bit code words and a plurality of said 3-bit code words;

forming a subsequent 4-bit data word with lower significant bits of the non-coincident data word;

determining a digital sum value of said channel bit stream;

detecting a code word "010" which is immediately followed by any one of said 6-bit code words; and replacing the detected code word with a substitute code word "000" if the replacement results in said digital sum value approaching zero.

6. A data modulation method comprising the steps of:

mapping, in a memory, 2-bit data words "00", "01", "10" and "11" to 3-bit code words "101", "100", "001" and "010", respectively, and mapping 4-bit data words "0000", "0001", "1000" and "1001" to 6-bit code words "000101", "000100", "000001" and "000010", respectively;

segmenting a data bit stream into a plurality of 4-bit data words;

converting each of the 4-bit data words to a 6-bit code word mapped in said memory if the 4-bit data word is coincident with one of said mapped 4-bit data words;

converting higher significant two bits of the 4-bit data word to a 3-bit code word mapped in said memory if the 4-bit data word is non-coincident with any of said mapped 4-bit data words;

forming a subsequent 4-bit data word with lower significant bits of the non-coincident data word so that a channel bit stream having no consecutive 1's is formed by a plurality of said 6-bit code words and a plurality of said 3-bit code words;

determining a digital sum value of said channel bit stream;

detecting a code word "000010" which is immediately followed by any one of said 3-bit code words; and replacing the detected code word with a substitute code word "000000" if the replacement results in said digital sum value approaching zero.

7. The data modulation method of claim 2, wherein, in said memory, a first group of 4-bit data words "001X", "01XX", "101X" and "11XX" are mapped to 3-bit code words "101", "100", "001", "010", respectively, a second group of 4-bit data words "0000", "0001", "1000" and "1001" are mapped to said 3-bit code words "101", "100", "001", "010", respectively, and a 4-bit data word "XXXX" is mapped to a 3-bit code word "000", where the symbol X represents either "1" or "0", wherein step (c) comprises using said first and second groups of data words to convert said two higher significant bits of each 4-bit data word if said first group was used to convert two higher significant bits of an immediately preceding 4-bit data word, and using said 4-bit data word "XXXX" to convert said two higher significant bits if said second group was used to convert said two higher significant bits of said immediately preceding 4-bit data word, wherein step (d) comprises detecting said first predetermined 3-bit code word when the first predetermined 3-bit code word is immediately preceded by said second predetermined 3-bit code word and if said first group of data words is used to convert subsequent two higher significant bits.

8. The data modulation method of claim 7, wherein said first predetermined 3-bit code word is "010" and said second predetermined code word is "000".

9. The data modulation method of claim 1, 2, 3, 4, 5, 6, 7 or 8, further comprising the steps of detecting a bit sequence "010.101.010" in said channel bit stream and replacing the detected bit sequence with a substitute bit sequence "000. 000. 000".

10. The data modulation method of claim 1,2,3, 4, 5,6, 7 or 8, wherein the step of replacing the detected code word further comprises updating said digital sum value.

11. The data modulation method of claim 1, 2, 3, 4, 5, 6, 7 or 8, further comprising the step of restoring said detected code word when a bit sequence having a predetermined number of consecutive 0's is formed in said channel bit stream due to the replacement of said detected code with said substitute code word "000".

12. The data modulation method of claim 1, 2, 3, 4, 5, 6, 7 or 8, further comprising the steps of generating a synchronization pattern and inserting the synchronization pattern to said channel bit stream.

13. The data modulation method of claim 12, wherein said synchronization pattern comprises a bit sequence "000. 000. 000."

14. The data modulation method of claim 1, 2, 3, 4, 5, 6, 7 or 8, further comprising the steps of:
storing a plurality of synchronization patterns in a memory;
selecting one of the synchronization patterns according to the amount of offset from starting point of a sector on a recording disc; and
inserting the selected synchronization pattern to said channel bit stream.

15. The data modulation method of claim 14, wherein each of said synchronization patterns comprises a bit sequence "000. 000. 000"

16. The data modulation method of claim 1, 2, 3, 4, 5, 6, 7 or 8, further comprising the steps of:
storing, in a memory, a first group of synchronization patterns of even-number of 1's and a second group of synchronization patterns of odd-number of 1's;
selecting one of the synchronization patterns of even-number of 1's from said first group and one of the synchronization patterns of odd-number of 1's from said second group according to the amount of offset from starting point of a sector on a recording disc;
choosing one of the selected synchronization patterns of even-number of 1's and odd-number of 1's so that the chosen synchronization pattern results in said digital sum value approaching zero; and
inserting the chosen synchronization pattern to said channel bit stream.

17. The data modulation apparatus of claim 16, wherein each of said synchronization patterns comprises a bit sequence "000. 000. 000."

18. The data modulation method of claim 1, 2, 3, 4, 5, 6, 7 or 8, further comprising the steps of:
mapping a plurality of code words to a plurality of data words in a memory;
receiving said channel bit stream and detecting a bit sequence "000. 000" in the received channel bit stream;
replacing the detected bit sequence with a substitute bit sequence; and
converting each code word of the channel bit stream to a data word corresponding to one of the data words mapped in said memory.

19. The data modulation method of claim 18, wherein said substitute bit sequence is "010. 000".

20. The data modulation method of claim 18, wherein said substitute bit sequence is "000. 010".

21. The data modulation method of claim 18, wherein the replacing step further comprises detecting a bit sequence "000. 000. 000" and replacing the detected bit sequence with a bit sequence "010. 101. 010".

22. The data modulation method of claim 18, wherein a plurality of 3-bit code words are mapped in said memory to a plurality of 2-bit data words and a plurality of 6-bit code words are mapped to a plurality of 4-bit data words.

23. A data modulation apparatus comprising:
conversion circuitry for converting each N-bit data word of a plurality of N-bit data words of a data bit stream to a corresponding M-bit code word of a plurality of M-bit code words to form a channel bit stream, where the integer M is greater than the integer N; and
control circuitry for determining a digital sum value of said channel bit stream, and for detecting a bit sequence of a predetermined pattern in the channel bit stream, and for replacing a bit "1" of the bit sequence in the channel bit stream with a bit "0" if the replacement results in said digital sum value approaching zero.

24. A data modulation apparatus comprising:
a memory for mapping a plurality of 4-bit data words to a plurality of 3-bit code words;
conversion circuitry for segmenting a data bit stream into a plurality of 4-bit data words and successively shifting two bits at a time, converting higher significant two bits of each 4-bit data word to a 3-bit code word correspondingly mapped to the 4-bit data word in said memory and converting lower significant two bits of the 4-bit data word as higher significant two bits of a subsequent 4-bit data word to a 3-bit code word correspondingly mapped to said subsequent 4-bit data word so that a channel bit stream having no consecutive 1's is produced by a plurality of said 3-bit code words; so that a channel bit stream having no consecutive 1's is produced by a plurality of said 3-bit code words; and
control circuitry for determining a digital sum value of said channel bit stream, detecting a first predetermined one of said 3-bit code words which is consecutive with a second predetermined one of said 3-bit code words, and replacing the detected code word with a substitute ode word "000" if the replacement results in said digital sum value approaching zero.

25. A data modulation apparatus comprising:
a memory for mapping 2-bit data words "00", "01", "10" and "11" to 3-bit code words "101", "100", "001" and "010", respectively, and mapping 4-bit data words "0000", "0001", "1000" and "1001" to 6-bit code words "101000", "100000", "001000" and "010000", respectively;

conversion circuitry for successively segmenting a data bit stream into a plurality of 4-bit data words, converting each of the 4-bit data words to a 6-bit code word mapped in said memory if the 4-bit data word is coincident with one of said mapped 4-bit data words, converting higher significant two bits of the 4-bit data word to a 3-bit code word mapped in said memory if the 4-bit data word is non-coincident with any of said mapped 4-bit data words, and forming a subsequent 4-bit data word with lower significant bits of the non-coincident data word so that a channel bit stream having no consecutive 1's is formed by a plurality of said 6-bit code words and a plurality of said 3-bit code words; and control circuitry for determining a digital sum value of said channel bit stream, detecting a code word "010" which occurs immediately following any one of said 6-bit code words, and replacing the detected code word with a substitute code word "000" if the replacement results in said digital sum value approaching zero.

26. A data modulation apparatus comprising:

a memory for mapping 2-bit data words "00", "01", "10" and "11" to 3-bit code words "101", "100", "001" and "010", respectively, and mapping 4-bit data words "0000", "0001", "1000" and "1001" to 6-bit code words "101000", "100000", "001000" and "010000", respectively;

conversion circuitry for successively segmenting a data bit stream into a plurality of 4-bit data words, converting each of the 4-bit data words to a 6-bit code word mapped in said memory if the 4-bit data word is coincident with one of said mapped 4-bit data words, converting higher significant two bits of the 4-bit data word to a 3-bit code word mapped in said memory if the 4-bit data word is non-coincident with any of said mapped 4-bit data words, and forming a subsequent 4-bit data word with lower significant bits of the non-coincident data word so that a channel bit stream having no consecutive 1's is formed by a plurality of said 6-bit code words and a plurality of said 3-bit code words; and control circuitry for determining a digital sum value of said channel bit stream, detecting a code word "010000" which occurs immediately following any one of said 3-bit code words, and replacing the detected code word with a substitute code word "000000" if the replacement results in said digital sum value approaching zero.

27. A data modulation apparatus comprising:

a memory for mapping 2-bit data words "00", "01", "10" and "11" to 3-bit code words "101", "100", "001" and "010", respectively, and mapping 4-bit data words "0000", "0001", "1000" and "1001" to 6-bit code words "000101", "000100", "000001" and "000010", respectively;

conversion circuitry for successively segmenting a data bit stream into a plurality of 4-bit data words, converting each of the 4-bit data words to a 6-bit code word mapped in said memory if the 4-bit data word is coincident with one of said mapped 4-bit data words, converting higher significant two bits of the 4-bit data word to a 3-bit code word mapped in said memory if the 4-bit data word is non-coincident with any of said mapped 4-bit data words, and forming a subsequent 4-bit data word with lower significant bits of the non-coincident data word so that a channel bit stream having no consecutive 1's is formed by a plurality of said 6-bit code words and a plurality of said 3-bit code words; and control circuitry for determining a digital sum value of said channel bit stream, detecting a code word "010" which is immediately followed by any one of said 6-bit code words, and replacing the detected code word with a substitute code word "000" if the replacement results in said digital sum value approaching zero.

28. A data modulation apparatus comprising:

a memory for mapping 2-bit data words "00", "01", "10" and "11" to 3-bit code words "101", "100", "001" and "010", respectively, and mapping 4-bit data words "0000", "0001", "1000" and "1001" to 6bit codewords "000101", "000100", "000001" and "000010", respectively;

conversion circuitry for successively segmenting a data bit stream into a plurality of 4-bit data words, converting each of the 4-bit data words to a 6-bit code word mapped in said memory if the 4-bit data word is coincident with one of said mapped 4-bit data words, converting higher significant two bits of the 4-bit data word to a 3-bit code word mapped in said memory if the 4-bit data word is non-coincident with any of said mapped 4-bit data words, and forming a subsequent 4-bit data word with lower significant bits of the non-coincident data word so that a channel bit stream having no consecutive 1's is formed by a plurality of said 6-bit code words and a plurality of said 3-bit code words; and control circuitry for determining a digital sum value of said channel bit stream, detecting a code word "000010" which is immediately followed by any one of said 3-bit code words, and replacing the detected code word with a substitute code word "000000" if the replacement results in said digital sum value approaching zero.

29. The data modulation apparatus of claim 24, wherein said memory maps a first group of 4-bit data words "001X", "01XX", "101X" and "11XX" to 3-bit code words "101", "100", "001", "010", respectively, maps a second group of 4-bit data words "0000", "0001", "1000" and "1001"to said 3-bit code words "101", "100", "001", "010", respectively, and maps a 4-bit data word "XXXX" to a 3-bit code word "000", where the symbol X represents either "1" or "0", wherein said conversion circuitry uses said first and second groups of data words to convert said two higher significant bits of each 4-bit data word if said first group was used to convert two higher significant bits of an immediately preceding 4-bit data word, and uses said 4-bit data word "XXXX" for converting said two higher significant bits if said second group was used to convert two higher significant bits of said immediately preceding 4-bit data word, wherein said control circuitry detects said first predetermined 3-bit code word when the first predetermined 3-bit code word is immediately preceded by said second predetermined 3-bit code word and if said first group of data words is used to convert subsequent two higher significant bits.

30. The data modulation apparatus of claim 29, wherein said first predetermined 3-bit code word is "010" and said second predetermined code word is "000".

31. The data modulation apparatus of claim 23, 24, 25, 26, 27, 28, 29 or 30, further comprising a replacement circuit for detecting a bit sequence "010. 101. 010" in said channel bit stream and replacing the detected bit sequence with a substitute bit sequence "000. 000. 000".

32. The data modulation apparatus of claim 23, 24, 25, 26, 27, 28, 29 or 30, wherein said control circuitry updates said digital sum value after the detected code word is replaced with said code word "000".

33. The data modulation apparatus of claim 23, 24, 25, 26, 27, 28, 29 or 30, wherein said control circuitry restores said detected code word when a bit sequence having a predetermined number of consecutive 0's is formed in said channel bit stream due to the replacement of said detected code with said substitute code word "000".

34. The data modulation apparatus of claim 23, 24, 25, 26, 27, 28, 29 or 30, further comprising means for generating a synchronization pattern and inserting the synchronization pattern to said channel bit stream.

35. The data modulation apparatus of claim 34, wherein said synchronization pattern comprises a bit sequence "000. 000. 000."

36. The data modulation apparatus of claim 23, 24, 25, 26, 27, 28, 29 or 30, further comprising:
a memory for storing a plurality of synchronization patterns;
means for selecting one of the synchronization patterns according to the amount of offset from starting point of a sector on a recording disc; and
means for inserting the selected synchronization pattern to said channel bit stream.

37. The data modulation apparatus of claim 36, wherein each of said synchronization patterns comprises a bit sequence "000. 000. 000."

38. The data modulation apparatus of claim 23, 24, 25, 26, 27, 28, 29 or 30, further comprising:
a memory for storing a first group of synchronization patterns of even-number of 1's and a second group of synchronization patterns of odd-number of 1's;
means for selecting one of the synchronization patterns of even-number of 1's from said first group and one of the synchronization patterns of odd-number of 1's from said second group according to the amount of offset from starting point of a sector on a recording disc;
means for choosing one of the selected synchronization patterns of even-number of 1's and odd-number of 1's so that the chosen synchronization pattern results in said digital sum value approaching zero; and
means for inserting the chosen synchronization pattern to said channel bit stream.

39. The data modulation apparatus of claim 38, wherein each of said synchronization patterns comprises a bit sequence "000. 000. 000.".

40. The data modulation apparatus of claim 23, 24, 25, 26, 27, 28, 29 or 30, further comprising:
replacement circuitry for receiving said channel bit stream and detecting a bit sequence "000. 000" in the received channel bit stream, and replacing the detected bit sequence with a substitute bit sequence;
a memory for mapping a plurality of code words to a plurality of data words; and
conversion circuitry for receiving the channel bit stream from said replacement circuitry and converting each code word of the channel bit stream to a data word corresponding to one of the mapped data words of said memory.

41. The data modulation apparatus of claim 40, wherein said substitute bit sequence is "010. 000".

42. The data modulation apparatus of claim 40, wherein said substitute bit sequence is "000. 010".

43. The data modulation apparatus of claim 40, wherein said replacement circuit further detects a bit sequence "000. 000. 000" and replacing the detected bit sequence with a bit sequence "010. 101. 010".

44. The data modulation apparatus of claim 40, wherein said memory maps a plurality of 3-bit code words to a plurality of 2-bit data words and maps a plurality of 6-bit code words to a plurality of 4-bit data words.

* * * * *